United States Patent
Han et al.

(10) Patent No.: US 11,733,730 B2
(45) Date of Patent: Aug. 22, 2023

(54) SEMICONDUCTOR APPARATUS INCLUDING A CLOCK PATH

(71) Applicant: SK hynix Inc., Icheon-si (KR)

(72) Inventors: Yun Tack Han, Icheon-si (KR); Sang Su Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/557,914

(22) Filed: Dec. 21, 2021

(65) Prior Publication Data

US 2023/0082056 A1 Mar. 16, 2023

(30) Foreign Application Priority Data

Sep. 15, 2021 (KR) ........................ 10-2021-0123073

(51) Int. Cl.
*G06F 1/08* (2006.01)
*H03K 5/135* (2006.01)
*H03L 7/08* (2006.01)

(52) U.S. Cl.
CPC .............. *G06F 1/08* (2013.01); *H03K 5/135* (2013.01); *H03L 7/0805* (2013.01)

(58) Field of Classification Search
CPC ..... G06F 1/08; G06F 1/06; G06F 1/10; G06F 1/12; G06F 1/04; G06F 1/3237; H03K 5/135; H03K 3/037; H03K 5/1534; G11C 7/222; G11C 7/1066; G11C 7/1093; G11C 7/1072; G11C 11/4076; G11C 29/023; G11C 7/109; H03L 7/07; H03L 7/06; H03L 7/08; H03L 7/00; H03L 7/0816; H03L 7/0812; H03L 7/0995; H03L 7/0814

See application file for complete search history.

(56) References Cited

U.S. PATENT DOCUMENTS

| | | | | |
|---|---|---|---|---|
| 7,135,899 | B1 * | 11/2006 | Sancheti | H04J 3/047 |
| | | | | 327/144 |
| 2008/0285696 | A1 * | 11/2008 | Kwan | G06F 1/08 |
| | | | | 375/373 |
| 2018/0331686 | A1 * | 11/2018 | Kim | G06F 1/08 |
| 2020/0381028 | A1 * | 12/2020 | Kim | G11C 29/06 |
| 2020/0381029 | A1 * | 12/2020 | Kim | G11C 11/4076 |

FOREIGN PATENT DOCUMENTS

KR 100929846 B1 12/2009

* cited by examiner

*Primary Examiner* — John W Poos
(74) *Attorney, Agent, or Firm* — William Park & Associates Ltd.

(57) ABSTRACT

A semiconductor apparatus includes an internal dock generating circuit, a stop controlling circuit, and a data dock generating circuit. The internal clock generating circuit generates, based on a reference clock signal, a plurality of internal clock signals. The stop controlling circuit generates a stop signal and a dock level signal based on the reference clock signal and the plurality of internal clock signals. The data clock generating circuit generates a data clock signal and a complementary data clock signal based on the plurality of internal clock signals, the stop signal, and the clock level signal.

14 Claims, 13 Drawing Sheets

FIG. 3
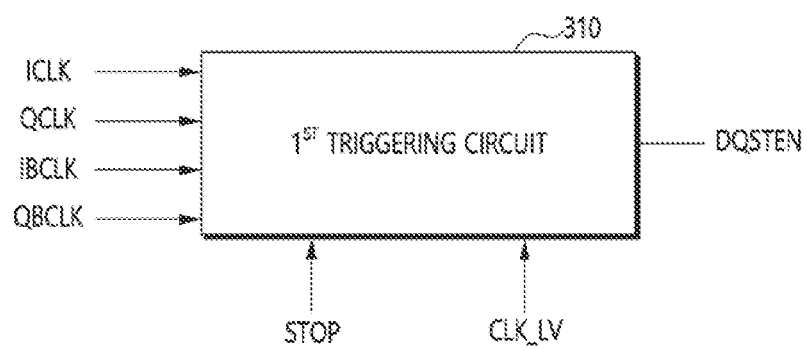
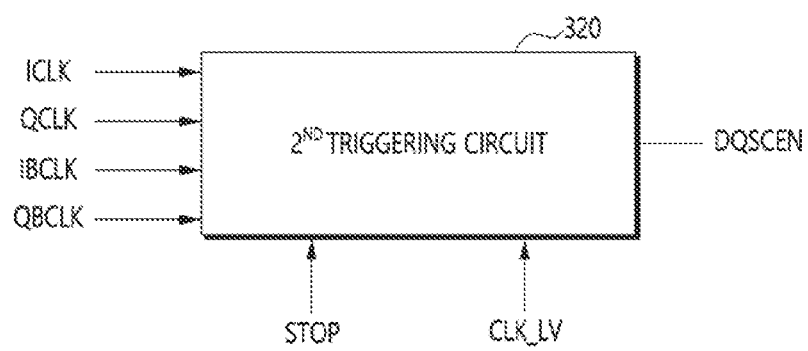

SEMICONDUCTOR APPARATUS INCLUDING A CLOCK PATH

CROSS-REFERENCES TO RELATED APPLICATION

The present application claims priority under 35 U.S.C. § 119(a) to Korean application number 10-2021-0123073, filed on Sep. 15, 2021, in the Korean Intellectual Property Office, which is incorporated herein by reference in its entirety as set forth in full.

BACKGROUND

1. Technical Field

Various embodiments generally relate to an integrated circuit technology, and, more particularly, to a semiconductor apparatus including a clock path.

2. Related Art

An electronic device includes a lot of electronic elements and a computer system as the electronic device includes lots of semiconductor apparatuses each configured to include a semiconductor. The semiconductor apparatuses configuring the computer system may include transmission circuits and reception circuits to communicate with each other. The semiconductor apparatus may generate internal clock signals having various phases by buffering or dividing a system clock signal. Because the semiconductor apparatus generates the internal clock signals through various internal circuits, there may occur asynchronous delay. Accordingly, there may occur phase differences between the internal clock signals and the system clock signal. In general, the semiconductor apparatus may be provided with a delay-locked loop circuit to generate a delayed clock signal having a phase in synchronization with the system clock signal by compensating for the asynchronous delay. By dividing the clock signal generated from the delay-locked loop circuit, the semiconductor apparatus may generate a plurality of internal clock signals having different phases. Also, the semiconductor apparatus may generate, based on the plurality of internal clock signals, a data clock signal in synchronization with the system clock signal.

SUMMARY

In an embodiment, a semiconductor apparatus may include an internal clock generating circuit, a stop controlling circuit, and a data clock generating circuit. The internal clock generating circuit may be configured to generate, based on a reference clock signal, a plurality of internal clock signals having different phases. The stop controlling circuit may be configured to generate a stop signal based on the plurality of internal clock signals and configured to generate a clock level signal based on the reference clock signal and the stop signal. The data clock generating circuit may be configured to generate a data clock signal and a complementary data clock signal based on the plurality of internal clock signals, the stop signal and the clock level signal.

In an embodiment, a semiconductor apparatus may include an internal clock generating circuit, a stop controlling circuit, and a data clock generating circuit. The internal clock generating circuit may be configured to generate, based on a reference dock signal, a plurality of internal clock signals having different phases. The stop controlling circuit may be configured to generate a stop signal based on the plurality of internal clock signals, configured to generate a dock level signal based on the reference clock signal and the stop signal and configured to generate a plurality of output dock signals based on the plurality of internal clock signals, the stop signal and the clock level signal. The data clock generating circuit may be configured to generate a data clock signal and a complementary data clock signal based on the plurality of output clock signals.

In an embodiment, a semiconductor system may include a first semiconductor apparatus and a second semiconductor apparatus. The first semiconductor apparatus may be configured to provide a system clock signal and configured to generate a command signal based on a data clock signal and a complementary data dock signal. The second semiconductor apparatus may be configured to generate a plurality of internal clock signals based on the system clock signal. The second semiconductor apparatus may be configured to generate the data clock signal and the complementary data clock signal based on the plurality of internal clock signals. The second semiconductor apparatus may be configured to fix the data clock signal and the complementary data clock signal to different logic levels when the system clock signal stops and configured to adjust driving force for driving the data clock signal and the complementary data clock signal based on the command signal.

BRIEF DESCRIPTION OF THE DRAWINGS

FIG. 3 is a block diagram illustrating a configuration of a triggering circuit illustrated in FIG. 1.

DETAILED DESCRIPTION

Figure 1:
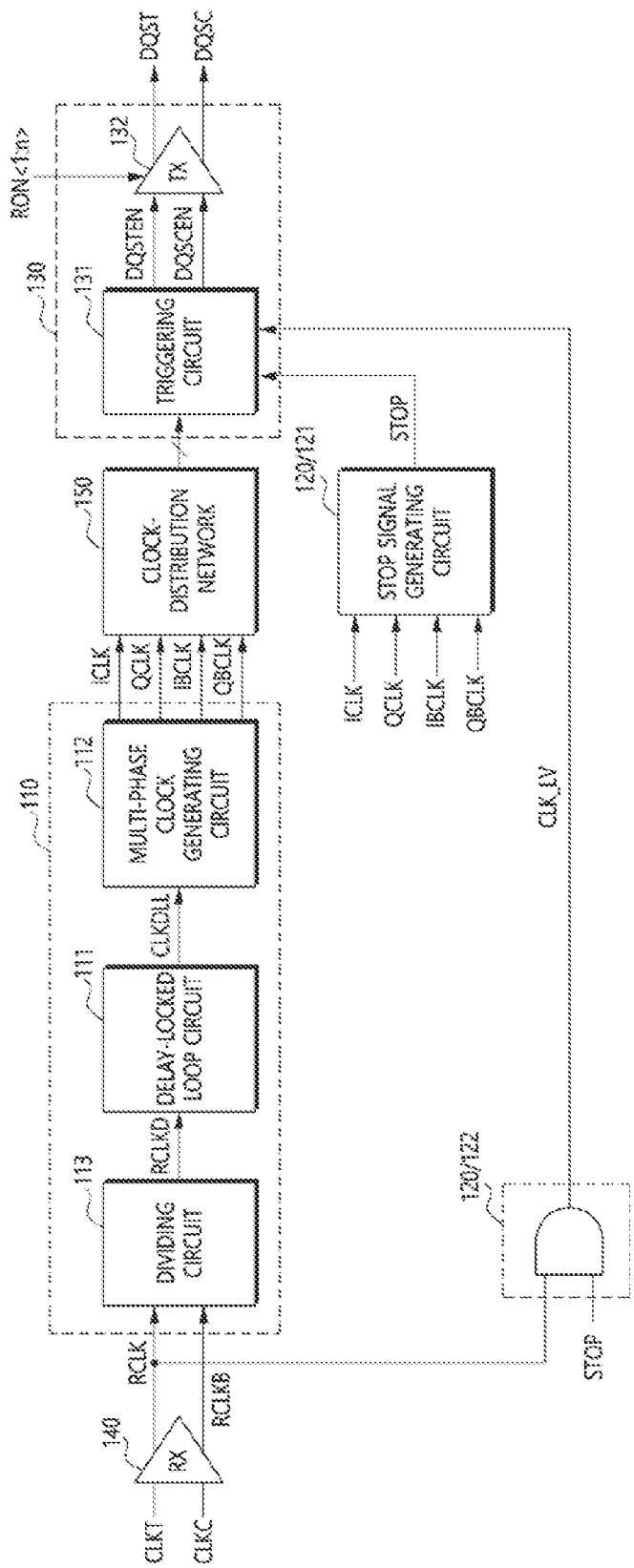
FIG. 1 is a diagram illustrating a configuration of a semiconductor apparatus including a clock path according to an embodiment.

FIG. 1 is a diagram illustrating a configuration of a semiconductor apparatus 100 including a clock path according to an embodiment. Referring to FIG. 1, the semiconductor apparatus 100 may receive a pair of system clock signals CLKT and CLKC and may output a pair of data clock signals DQST and DQSC. The pair of system clock signals CLKT and CLKC may be external signals provided from an external apparatus (not illustrated) to the semiconductor apparatus 100. The pair of system clock signals CLKT and CLKC may include a system clock signal CLKT and a complementary system clock signal CLKC. The complementary system clock signal CLKC may have a phase difference of 180° from the system clock signal CLKT. The semiconductor apparatus 100 may include a clock path. Through the clock path, the semiconductor apparatus 100 may generate the pair of data clock signals DQST and DQSC from the pair of system clock signals CLKT and CLKC. The pair of data clock signals DQST and DQSC may include a data clock signal DQST and a complementary data clock signal DQSC. The complementary data clock signal DQSC may have a phase difference of 180° from the data clock signal DQST. The clock path may include all internal circuits, through which the pair of system clock signals CLKT and CLKC are propagated until the pair of data clock signals DQST and DQSC are generated.

The semiconductor apparatus 100 may include an internal clock generating circuit 110, a stop controlling circuit 120, and a data clock generating circuit 130. The internal clock generating circuit 110 may receive a reference clock signal RCLK and may generate a plurality of internal clock signals ICLK, QCLK, IBCLK, and QBCLK based on the reference clock signal RCLK. In an embodiment, the internal clock generating circuit 110 may further receive a complementary reference clock signal RCLKB and may generate the plurality of internal clock signals ICLK, QCLK, IBCLK, and QBCLK based on the reference clock signal RCLK and the complementary reference clock signal RCLKB. The reference clock signal RCLK may be a clock signal generated by buffering the pair of system clock signals CLKT and CLKC. The semiconductor apparatus 100 may further include a clock receiver (RX) 140. The clock receiver 140 may receive the pair of system clock signals CLKT and CLKC from the external apparatus and may generate the reference clock signal RCLK by differentially amplifying the pair of system clock signals CLKT and CLKC. The reference clock signal RCLK may have a phase corresponding to the system clock signal CLKT. Actually, the reference clock signal RCLK may have a phase slightly lagging behind the system clock signal CLKT due to delay occurring in the clock receiver 140. The internal clock generating circuit 110 may perform a delay-locking operation on the reference clock signal RCLK to generate the plurality of internal clock signals ICLK, QCLK, IBCLK and QBCLK having different phases. For example, the plurality of internal clock signals ICLK, QCLK, IBCLK and QBCLK may include a first internal clock signal ICLK, a second internal clock signal QCLK, a third internal clock signal IBCLK and a fourth internal clock signal QBCLK. The first to fourth internal clock signals ICLK, QCLK, IBCLK and QBCLK may sequentially have a phase difference of 90° from each other. The first internal clock signal ICLK may have a phase leading the second internal dock sign& QCLK by 90°. The second internet clock signal QCLK may have a phase leading the third internal dock signal IBCLK by 90°, The third internal clock signal IBCLK may have a phase leading the fourth internal clock signal QBCLK by 90°. The fourth internal clock signal QBCLK may have a phase leading the first internal clock signal ICLK by 90°.

The internal clock generating circuit 110 may include a delay-locked loop circuit 111 and a multi-phase clock generating circuit 112. The delay-locked loop circuit 111 may generate a delay-locked clock signal CLKDLL by receiving the reference clock signal RCLK and performing a delay-locking operation on the reference dock signal RCLK. In the dock path of the semiconductor apparatus 100, there may occur delay due to the dock receiver 140 and internal circuits described later. Therefore, there may be a case that a dock signal propagated through the dock path ends up having a phase difference from the system clock signal CLKT. The delay-locked loop circuit 111 may delay the reference clock signal RCLK to compensate for the propagation delay of the dock path thereby synchronizing the pair of data clock signals DQST and DQSC with the pair of system clock signals CLKT and CLKC. For example, a sum of a delay time amount, by which the delay-locked loop circuit 111 delays the reference clock signal RCLK, and a time amount of the propagation delay may correspond to a multiple of a period of the pair of system clock signals CLKT and CLKC. The delay-locked loop circuit 111 may include any kind of delay-locked loop configured to perform a delay-locking operation. For example, the delay-locked loop circuit 111 may include a digital delay-locked loop.

The multi-phase clock generating circuit 112 may be coupled to the delay-locked loop circuit 111 and may receive the delay-locked clock signal CLKDLL from the delay-locked loop circuit 111. The multi-phase clock generating circuit 112 may generate the plurality of internal clock signals ICLK, QCLK, IBCLK and QBCLK based on the delay-locked clock signal CLKDLL. The multi-phase clock generating circuit 112 may generate the first to fourth internal clock signals ICLK, QCLK, IBCLK and QBCLK by additionally performing a delay-locking operation on the delay-locked clock signal CLKDLL. The multi-phase clock generating circuit 112 may divide the delay-locked clock signal CLKDLL and may interpolate a phase of the divided clock signal to generate the first to fourth internal clock signals ICLK, QCLK, IBCLK and QBCLK. The multi-phase clock generating circuit 112 may include any kind of clock generator configured to generate a plurality of clock signals having different phases. For example, the multi-phase clock generating circuit 112 may include at least one of another digital delay-locked loop, an analogue delay-locked loop and a phase interpolator.

The internal clock generating circuit 110 may further include a dividing circuit 113. The dividing circuit 113 may divide the reference clock signal RCLK to generate a divided reference clock signal RCLKD. The dividing circuit 113 may divide a frequency of the reference clock signal RCLK to generate the divided reference clock signal RCLKD. The divided reference clock signal RCLKD may have a lower frequency than the reference clock signal RCLK. For example, the frequency of the divided reference clock signal RCLKD may be a half (½) of the frequency of the reference clock signal RCLK. When provided with the dividing circuit 113, the delay-locked loop circuit 111 may receive the divided reference clock signal RCLKD and may perform a delay-locking operation on the divided reference clock signal RCLKD. In an embodiment, when the delay-locked loop circuit 111 receives the divided reference clock signal RCLKD and performs a delay-locking operation on the divided reference clock signal RCLKD, adjusted may be a period of updating the delay time amount of the delay-locked loop circuit 111 may be adjusted and thus power consumption for a delay-locking operation may be reduced. Further, in some embodiments, because the delay-locked loop circuit 111 performs a delay-locking operation on the clock signal having a lower frequency, reliability of a delay-locking operation may be improved.

The stop controlling circuit 120 may be provided in order to monitor a parameter of the semiconductor apparatus 100. The parameter of the semiconductor apparatus 100 may be a value or information including any kind of operation status or specification of the semiconductor apparatus 100. For example, the parameter of the semiconductor apparatus 100 may be an operating resistance value of the data clock generating circuit 130 configured to generate the pair of data clock signals DQST and DQSC. The operating resistance value may be related to driving force and/or strength driving the pair of data clock signals DQST and DQSC. By fixing the pair of data clock signals DQST and DQSC to different logic levels, the stop controlling circuit 120 may allow an external apparatus, which receives the pair of data clock signals DQST and DQSC, to monitor and/or measure the operating resistance value of the semiconductor apparatus 100. The external apparatus may fix the pair of system clock signals CLKT and CLKC to particular logic levels to measure the operating resistance value of the semiconductor apparatus 100. For example, the semiconductor apparatus 100 may receive, from the external apparatus, the system clock signal CLKT fixed to a low logic level and the complementary system clock signal CLKC fixed to a high logic level. For example, the semiconductor apparatus 100 may receive, from the external apparatus, the system clock signal CLKT fixed to a high logic level and the complementary system clock signal CLKC fixed to a low logic level.

The stop controlling circuit 120 may receive the reference clock signal RCLK and the plurality of internal clock signals ICLK, QCLK, IBCLK and QBCLK and may generate a stop signal STOP and a dock level signal CLK_LV. Based on the plurality of internal clock signals ICLK, QCLK, IBCLK and QBCLK, the stop controlling circuit 120 may generate the stop signal STOP. The stop controlling circuit 120 may detect logic levels of the plurality of internal dock signals ICLK, QCLK, IBCLK and QBCLK to generate the stop signal STOP. Based on the reference clock signal RCLK and the stop signal STOP, the stop controlling circuit 120 may generate the clock level signal CLK_LV. When the stop signal STOP becomes enabled, the stop controlling circuit 120 may provide the reference clock signal RCLK as the dock level signal CLK_LV.

The stop controlling circuit 120 may include a stop signal generating circuit 121 and a gating circuit 122. The stop signal generating circuit 121 may receive the plurality of internal dock signals ICLK, QCLK, IBCLK and QBCLK. The stop signal generating circuit 121 may detect the logic levels of the plurality of internal clock signals ICLK, QCLK, IBCLK and QBCLK to generate the stop signal STOP. The stop signal generating circuit 121 may enable the stop signal STOP when all the plurality of internal clock signals ICLK, QCLK, IBCLK and QBCLK have the same logic level. For example, the stop signal generating circuit 121 may enable the stop signal STOP when all the plurality of internal clock signals ICLK, QCLK, IBCLK and QBCLK have a high logic level. When the logic levels of the pair of system clock signals CLKT and CLKC are fixed, all the first to fourth internal clock signals ICLK, QCLK, IBCLK and QBCLK output from the internal clock generating circuit 110 may be fixed to a high logic level. When all the first to fourth internal clock signals ICLK, QCLK, IBCLK and QBCLK have a high logic level, the stop controlling circuit 120 may detect that the pair of system clock signals CLKT and CLKC are stopped, and may enable the stop signal STOP.

The gating circuit 122 may receive the reference clock signal RCLK and the stop signal STOP. The gating circuit 122 may generate the clock level signal CLK_LV based on the reference clock signal RCLK and the stop signal STOP. The gating circuit 122 may gate the reference clock signal RCLK based on the stop signal STOP. When the stop signal STOP is in a disabled status, the gating circuit 122 may block the reference clock signal RCLK not to provide the reference clock signal RCLK as the clock level signal CLK_LV. When the stop signal STOP becomes enabled, the gating circuit 122 may provide the reference clock signal RCLK as the clock level signal CLK_LV. The gating circuit 122 may include an AND gate. The AND gate may receive the reference clock signal RCLK and the stop signal STOP and may perform an AND operation on the reference clock signal RCLK and the stop signal STOP to output the clock level signal CLK_LV.

The data clock generating circuit 130 may generate the data clock signal DQST and the complementary data clock signal DQSC based on the plurality of internal clock signals ICLK, QCLK, IBCLK and QBCLK, the stop signal STOP and the clock level signal CLK_LV. When the stop signal STOP is in a disabled status, the data clock generating circuit 130 may generate the data clock signal DQST and the complementary data clock signal DQSC based on the plurality of internal clock signals ICLK, QCLK, IBCLK and QBCLK. The data clock signal DQST and the complementary data clock signal DQSC may toggle according to a periodic change of logic levels of the plurality of internal clock signals ICLK, QCLK, IBCLK and QBCLK. When the stop signal STOP becomes enabled, the data dock generating circuit 130 may generate the data clock signal DQST and the complementary data clock signal DQSC based on the dock level signal CLK_LV. According to the dock level signal CLK_LV, the data clock generating circuit 130 may fix the data clock signal DQST and the complementary data clock signal DQSC to different logic levels. For example, the data clock generating circuit 130 may fix the data clock signal DQST to a logic level corresponding to the clock level signal CLK_LV and may fix the complementary data clock signal DQSC to a logic level opposite to the clock level signal CLK_LV.

The data clock generating circuit 130 may include a triggering circuit 131 and a data clock transmitter (TX) 132. The triggering circuit 131 may receive the plurality of internal clock signals ICLK, QCLK, IBCLK and QBCLK, the stop signal STOP and the clock level signal CLK_LV and may generate a data clock driving signal DQSTEN and a complementary data clock driving signal DQSCEN. When the stop signal STOP becomes disabled, the triggering circuit 131 may generate the data clock driving signal DQSTEN and the complementary data clock driving signal DQSCEN based on the plurality of internal clock signals ICLK, QCLK, IBCLK and QBCLK. When the stop signal STOP becomes enabled, the triggering circuit 131 may fix the data clock driving signal DQSTEN and the complementary data clock driving signal DQSCEN to particular logic levels based on the clock level signal CLK_LV. The triggering circuit 131 may fix the data clock driving signal DQSTEN to a logic level corresponding to the clock level signal CLK_LV and may fix the complementary data clock driving signal DQSCEN to a logic level opposite to the clock level signal CLK_LV.

The data clock transmitter 132 may receive the data clock driving signal DQSTEN and the complementary data clock driving signal DQSCEN and may generate the data clock signal DQST and the complementary data clock signal DQSC. The data clock transmitter 132 may output, to the external apparatus, the data clock signal DQST and the complementary data clock signal DQSC. The data clock transmitter 132 may receive a resistance setting signal RON<1:n> ('n' is an integer equal to or greater than two). An operating resistance value of the data clock transmitter 132 may be determined according to the resistance setting signal RON<1:n>. Based on the resistance setting signal RON<1:n>, determined may be driving force and/or strength, with which the data clock transmitter 132 drives the data clock signal DQST and the complementary data clock signal DQSC based on the data clock driving signal DQSTEN and the complementary data clock driving signal DQSCEN. The resistance setting signal RON<1:n> may determine driving force and/or strength, with which the data dock transmitter 132 pull-up drives the data clock signal DQST and the complementary data clock signal DQSC to a high logic level, and may determine driving force and/or strength, with which the data dock transmitter 132 pull-down drives the data clock signal DQST and the complementary data clock signal DQSC to a low logic level.

Figure 2:
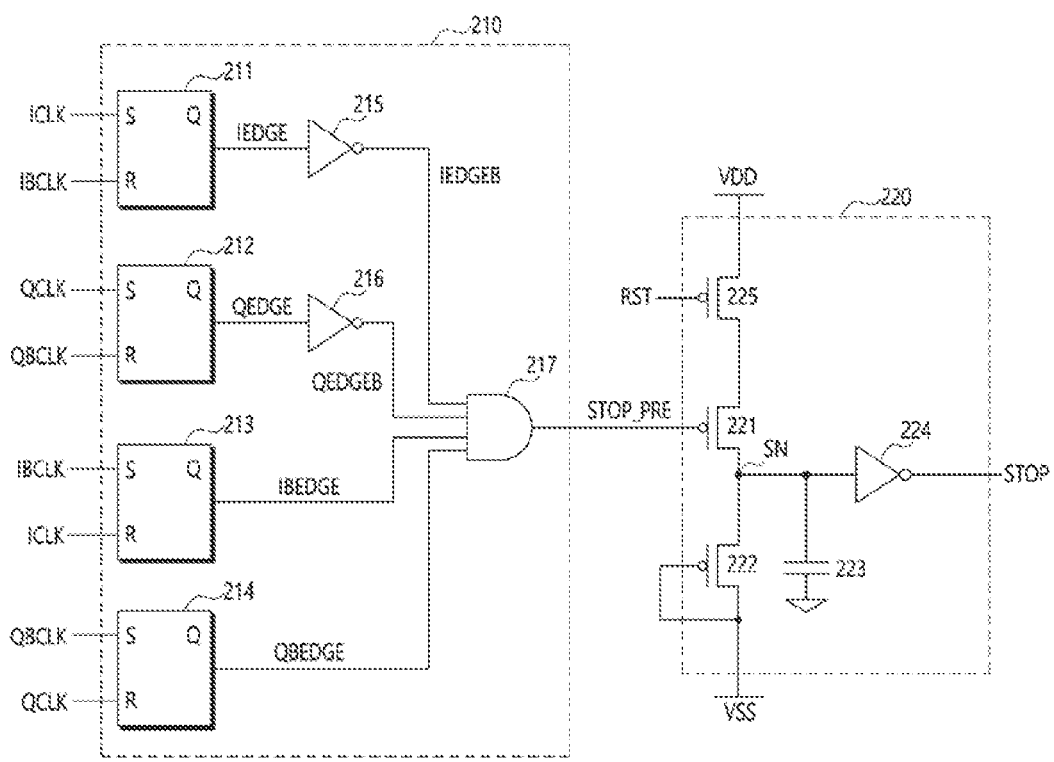
FIG. 2 is a diagram illustrating a configuration of a stop signal generating circuit illustrated in FIG. 1.

The semiconductor apparatus 100 may further include a clock-distribution network 150. The clock-distribution network 150 may be coupled between the internal clock generating circuit 110 and the data clock generating circuit 130. The dock-distribution network 150 may be a dock tree. The dock-distribution network 150 may receive the plurality of internal clock signals ICLK, QCLK, IBCLK and QBCLK from the multi-phase clock generating circuit 112 and may drive the plurality of internal clock signals ICLK, QCLK, IBCLK and QBCLK. The clock-distribution network 150 may provide the data clock generating circuit 130 with the plurality of internal clock signals ICLK, QCLK, IBCLK and QBCLK, which are driven. The dock-distribution network 150 may drive the first to fourth internal dock signals ICLK, QCLK, IBCLK and QBCLK and may provide the data clock generating circuit 130 with the first to fourth internal clock signals ICLK, QCLK, IBCLK and QBCLK. In an embodiment, the clock-distribution network 150 may be provided between the delay-locked loop circuit 111 and the multi-phase clock generating circuit 112. In an embodiment, when the clock-distribution network 150 is provided between the delay-locked loop circuit 111 and the mufti-phase dock generating circuit 112, the clock-distribution network 150 may be configured to drive the delay-locked clock signal CLKDLL to provide the mufti-phase clock generating circuit 112 with the delay-locked clock signal CLKDLL, FIG. 2 is a diagram illustrating a configuration of the stop signal generating circuit 121 illustrated in FIG. 1. Referring to FIG. 2, the stop signal generating circuit 121 may include a preliminary stop signal generator 210 and a stop signal driver 220. The preliminary stop signal generator 210 may receive the plurality of internal clock signals ICLK, QCLK, IBCLK and QBCLK and may generate a preliminary stop signal STOP_PRE based on the plurality of internal clock signals ICLK, QCLK, IBCLK and QBCLK. The preliminary stop signal generator 210 may detect logic levels of the plurality of internal clock signals ICLK, QCLK, IBCLK and QBCLK to generate the preliminary stop signal STOP_PRE. When the logic levels of the plurality of internal clock signals ICLK, QCLK, IBCLK and QBCLK change periodically, the preliminary stop signal generator 210 may enable and disable the preliminary stop signal STOP_PRE periodically. When the plurality of internal clock signals ICLK, QCLK, IBCLK and QBCLK are fixed to a particular logic level, the preliminary stop signal generator 210 may enable the preliminary stop signal STOP_PRE and may keep the preliminary stop signal STOP_PRE enabled. The stop signal driver 220 may receive the preliminary stop signal STOP_PRE and may generate the stop signal STOP based on the preliminary stop signal STOP_PRE. When the preliminary stop signal STOP_PRE stays enabled for a predetermined time amount, the stop signal driver 220 may enable the stop signal STOP. When the preliminary stop signal STOP_PRE is enabled and disabled periodically, the stop signal driver 220 might not enable the stop signal STOP. The stop signal driver 220 may enable the stop signal STOP when the plurality of internal clock signals ICLK, QCLK, IBCLK and QBCLK are fixed to a particular logic level and the preliminary stop signal STOP_PRE stays enabled. The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The preliminary stop signal generator 210 may include a first flip-flop 211, a second flip-flop 212, a third flip-flop 213, a fourth flip-flop 214, a first inverter 215, a second inverter 216 and an AND gate 217. Each of the first to fourth flip-flop 211, 212, 213 and 214 may be a SR flip-flop. The first flip-flop 211 may receive the first internal clock signal ICLK at a set node 5, may receive the third internal clock signal IBCLK at a reset node R and may output a first edge signal IEDGE at an output node Q. The first flip-flop 211 may enable the first edge signal IEDGE to a high logic level when the first internal clock signal ICLK transitions from a low logic level to a high logic level. The first flip-flop 211 may disable the first edge signal IEDGE to a low logic level when the third internal clock signal IBCLK transitions from a low logic level to a high logic level. The second flip-flop 212 may receive the second internal clock signal QCLK at a set node S, may receive the fourth internal clock signal QBCLK at a reset node R and may output a second edge signal QEDGE at an output node Q. The second flip-flop 212 may enable the second edge signal QEDGE to a high logic level when the second internal clock signal QCLK transitions from a low logic level to a high logic level. The second flip-flop 212 may disable the second edge signal QEDGE to a low logic level when the fourth internal clock signal QBCLK transitions from a low logic level to a high logic level. The third flip-flop 213 may receive the third internal clock signal IBCLK at a set node S, may receive the first internal clock signal ICLK at a reset node R and may output a third edge signal IBEDGE at an output node Q. The third flip-flop 213 may enable the third edge signal IBEDGE to a high logic level when the third internal clock signal IBCLK transitions from a low logic level to a high logic level. The third flip-flop 213 may disable the third edge signal IBEDGE to a low logic level when the first internal clock signal ICLK transitions from a low logic level to a high logic level. The fourth flip-flop 214 may receive the fourth internal clock signal QBCLK at a set node S, may receive the second internal clock signal QCLK at a reset node R and may output a fourth edge signal QBEDGE at an output node Q. The fourth flip-flop 214 may enable the fourth edge signal QBEDGE to a high logic level when the fourth internal clock signal QBCLK transitions from a low logic level to a high logic level. The fourth flip-flop 214 may disable the fourth edge signal QBEDGE to a low logic level when the second internal clock signal QCLK transitions from a low logic level to a high logic level. The first inverter 215 may receive the first edge signal IEDGE and may invert the first edge signal IEDGE to output an inverted first edge signal IEDGEB. The second inverter 216 may receive the second edge signal QEDGE and may invert the second edge signal QEDGE to output an inverted second edge signal QEDGEB. The AND gate 217 may receive the output of the first inverter 215, the output of the second inverter 216, the third edge signal IBEDGE and the fourth edge signal QBEDGE. The AND gate 217 may perform an AND operation on the inverted first edge signal IEDGEB, the inverted second edge signal QEDGEB, the third edge signal IBEDGE and the fourth edge signal QBEDGE to output the preliminary stop signal STOP_PRE. For example, when the system clock signal CLKT is fixed to a particular logic level and the reference clock signal RCLK is fixed to a low logic level or a high logic level, the first to fourth internal clock signals ICLK, QCLK, IBCLK and QBCLK may sequentially transition to a high logic level. Therefore, the first flip-flop 211 and the second flip-flop 212 may generate the first edge signal IEDGE and the second edge signal QEDGE having a low logic level, respectively, and the third flip-flop 213 and the fourth flip-flop 214 may generate the third edge signal IBEDGE and the fourth edge signal QBEDGE having a high logic level, respectively. The AND gate 217 may receive the inverted first edge signal IEDGEB, the inverted second edge signal QEDGEB, the third edge signal IBEDGE and the fourth edge signal QBEDGE having a high logic level, and thus the AND gate 217 may enable the preliminary stop signal STOP_PRE and may keep the preliminary stop signal STOP_PRE enabled.

The stop signal driver 220 may include a first transistor 221, a second transistor 222, a capacitor 223 and an inverter 224. Each of the first transistor 221 and the second transistor 222 may be a P-channel MOS transistor. The first transistor 221 may receive the preliminary stop signal STOP_PRE at its gate and may be coupled to a node, through which a first power voltage VDD is supplied, at its source and may be coupled to a detecting node SN at its drain. The second transistor 222 may be coupled to a node, through which a second power voltage VSS is supplied, at its gate and drain and may be coupled to the detecting node SN at its source. The second power voltage VSS may have a lower voltage level than the first power voltage VDD. For example, the first power voltage VDD may be a power voltage of the semiconductor apparatus 100 and the second power voltage VSS may be a ground voltage. The capacitor 223 may be coupled to the detecting node SN at one end thereof and may be coupled to the node, through which the second power voltage VSS is supplied, at the other end thereof. The inverter 224 may be coupled to the detecting node SN at its input node and may output the stop signal STOP at its output node. The stop signal driver 220 may further include a third transistor 225. The third transistor 225 may be a P-channel MOS transistor. The third transistor 225 may be coupled between the first transistor 221 and the node, through which the first power voltage VDD is supplied, and may receive a reset signal RST. When the reset signal RST is enabled, the third transistor 225 may block the first power voltage VDD not to provide the first power voltage VDD to the first transistor 221. When the reset signal RST is disabled, the third transistor 225 may provide the first power voltage VDD to the first transistor 221. When the preliminary stop signal STOP_PRE is periodically enabled, the stop signal driver 220 may periodically provide the detecting node SN with the first power voltage VDD and thus a charge amount in the capacitor 223 may be kept and the detecting node SN may stay to a high logic level. When the preliminary stop signal STOP_PRE stays enabled for a predetermined time amount or more, the first power voltage VDD might not be provided to the detecting node SN and the capacitor 223 may be discharged for the predetermined time amount and therefore the logic level of the detecting node SN may change to a low logic level. When the detecting node SN becomes to have a low logic level, the stop signal STOP may be enabled. The predetermined time amount may depend on a capacitance of the capacitor 223.

FIG. 3 is a block diagram illustrating a configuration of the triggering circuit 131 illustrated in FIG. 1. Referring to FIG. 3, the triggering circuit 131 may include a first triggering circuit 310 and a second triggering circuit 320. The first triggering circuit 310 may receive the plurality of internal clock signals ICLK, QCLK, IBCLK and QBCLK, the stop signal STOP and the dock level signal CLK_LV and may generate the data dock driving signal DQSTEN. When the stop signal STOP is in a disabled status, the first triggering circuit 310 may enable and disable the data dock driving signal DQSTEN according to logic levels of the plurality of internal clock signals ICLK, QCLK, IBCLK and QBCLK. When the stop signal STOP becomes enabled, the first triggering circuit 310 may fix the data clock driving signal DQSTEN to a particular logic level according to the clock level signal CLK_LV. The second triggering circuit 320 may receive the plurality of internal clock signals ICLK, QCLK, IBCLK and QBCLK, the stop signal STOP and the clock level signal CLK_LV and may generate the complementary data clock driving signal DQSCEN. When the stop signal STOP is in a disabled status, the second triggering circuit 320 may enable and disable the complementary data clock driving signal DQSCEN according to the logic levels of the plurality of internal clock signals ICLK, QCLK, IBCLK and QBCLK. When the stop signal STOP becomes enabled, the second triggering circuit 320 may fix the complementary data clock driving signal DQSCEN to a particular logic level according to the clock level signal CLK_LV.

Figure 4:
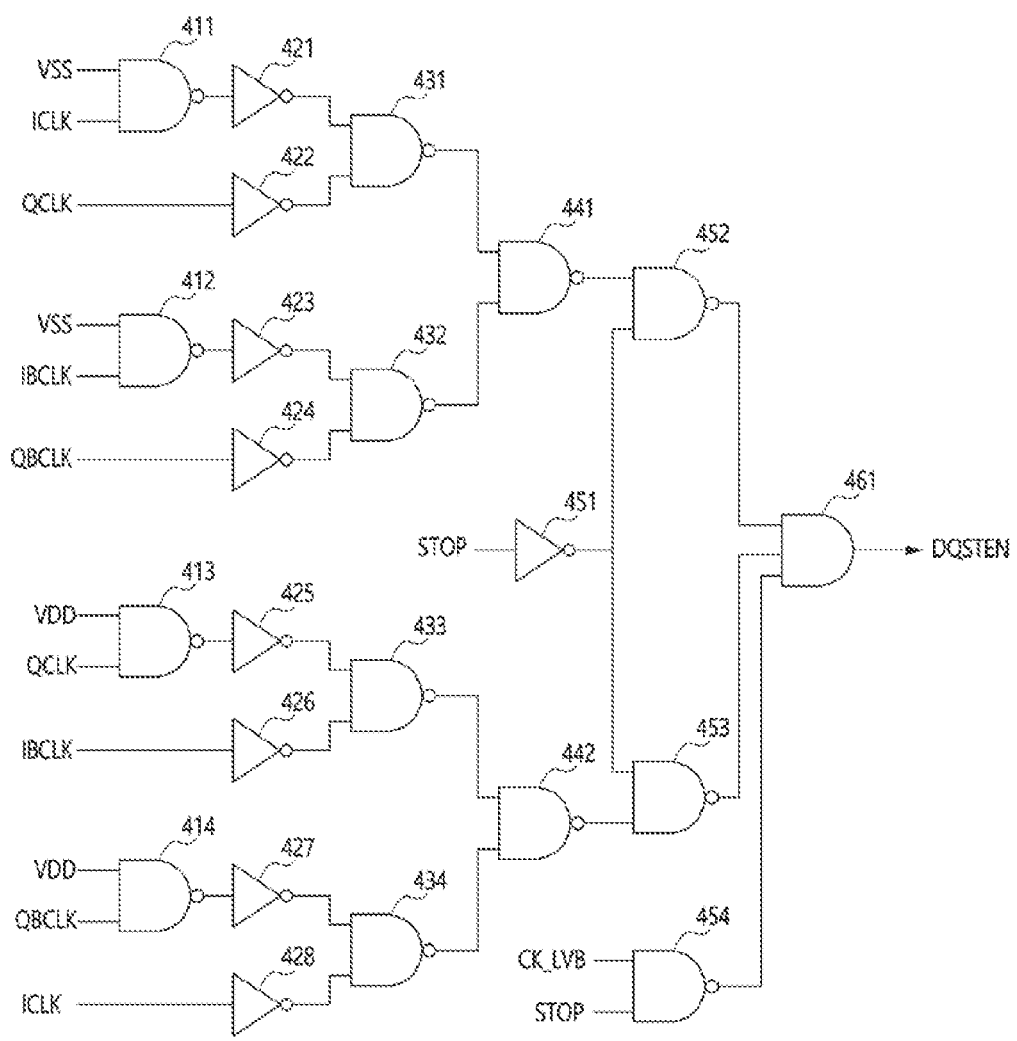
FIG. 4 is a diagram illustrating a configuration of a first triggering circuit illustrated in FIG. 3.

FIG. 4 is a diagram illustrating a configuration of the first triggering circuit 310 illustrated in FIG. 3. Referring to FIG. 4, the first triggering circuit 310 may include a first NAND gate 411, a second NAND gate 412, a third NAND gate 413, a fourth NAND gate 414, a first inverter 421, a second inverter 422, a third inverter 423, a fourth inverter 424, a fifth inverter 425, a sixth inverter 426, a seventh inverter 427, an eighth inverter 428, a fifth NAND gate 431, a sixth NAND gate 432, a seventh NAND gate 433, an eighth NAND gate 434, a ninth NAND gate 441, a tenth NAND gate 442, a ninth inverter 451, an eleventh NAND gate 452, a twelfth NAND gate 453, a thirteenth NAND gate 454 and an AND gate 461. The first NAND gate 411 may receive the second power voltage VSS and the first internal clock signal ICLK. The second NAND gate 412 may receive the second power voltage VSS and the third internal clock signal IBCLK. The third NAND gate 413 may receive the first power voltage VDD and the second internal clock signal QCLK. The fourth NAND gate 414 may receive the first power voltage VDD and the fourth internal clock signal QBCLK. The first inverter 421 may receive an output of the first NAND gate 411 and may invert the output of the first NAND gate 411. The second inverter 422 may receive the second internal clock signal QCLK and may invert the second internal clock signal QCLK. The third inverter 423 may receive an output of the second NAND gate 412 and may invert the output of the second NAND gate 412. The fourth inverter 424 may receive the fourth internal clock signal QBCLK and may invert the fourth internal clock signal QBCLK. The fifth inverter 425 may receive an output of the third NAND gate 413 and may invert the output of the third NAND gate 413. The sixth inverter 426 may receive the third internal clock signal IBCLK and may invert the third internal clock signal IBCLK. The seventh inverter 427 may receive an output of the fourth NAND gate 414 and may invert the output of the fourth NAND gate 414. The eighth inverter 428 may receive the first internal clock signal ICLK and may invert the first internal clock signal ICLK.

Figure 5:
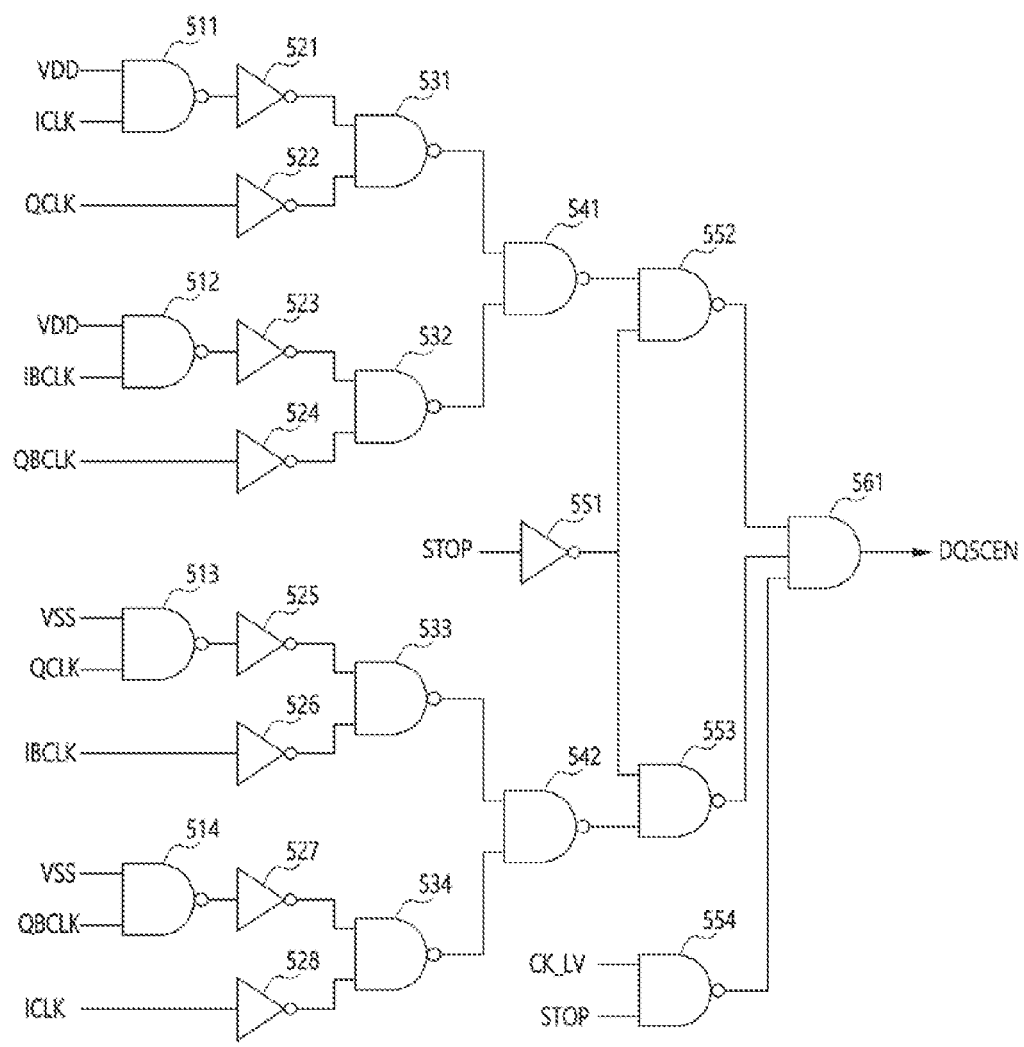
FIG. 5 is a diagram illustrating a configuration of a second triggering circuit illustrated in FIG. 3.

The fifth NAND gate 431 may receive outputs of the first inverter 421 and the second inverter 422. The sixth NAND gate 432 may receive outputs of the third inverter 423 and the fourth inverter 424. The seventh NAND gate 433 may receive outputs of the fifth inverter 425 and the sixth inverter 426. The eighth NAND gate 434 may receive outputs of the seventh inverter 427 and the eighth inverter 428. The ninth NAND gate 441 may receive outputs of the fifth NAND gate 431 and the sixth NAND gate 432. The tenth NAND gate 442 may receive outputs of the seventh NAND gate 433 and the eighth NAND gate 434. The ninth inverter 451 may receive the stop signal STOP and may invert the stop signal STOP. The eleventh NAND gate 452 may receive outputs of the ninth NAND gate 441 and the ninth inverter 451. The twelfth NAND gate 453 may receive outputs of the tenth NAND gate 442 and the ninth inverter 451. The thirteenth NAND gate 454 may receive the stop signal STOP and a complementary signal CLK_LVB of the dock level signal CLK_LV. The AND gate 461 may receive outputs of the eleventh NAND gate 452, the twelfth NAND gate 453 and the thirteenth NAND gate 454 and may generate the data dock driving signal DQSTEN, FIG. 5 is a diagram illustrating a configuration of the second triggering circuit 320 illustrated in FIG. 3. Referring to FIG. 5, the second triggering circuit 320 may include a first NAND gate 511, a second NAND gate 512, a third NAND gate 513, a fourth NAND gate 514, a first inverter 521, a second inverter 522, a third inverter 523, a fourth inverter 524, a fifth inverter 525, a sixth inverter 526, a seventh inverter 527, an eighth inverter 528, a fifth NAND gate 531, a sixth NAND gate 532, a seventh NAND gate 533, an eighth NAND gate 534, a ninth NAND gate 541, a tenth NAND gate 542, a ninth inverter 551, an eleventh NAND gate 552, a twelfth NAND gate 553, a thirteenth NAND gate 554 and an AND gate 561. The first NAND gate 511 may receive the first power voltage VDD and the first internal clock signal ICLK. The second NAND gate 512 may receive the first power voltage VDD and the third internal clock signal IBCLK. The third NAND gate 513 may receive the second power voltage VSS and the second internal clock signal QCLK. The fourth NAND gate 514 may receive the second power voltage VSS and the fourth internal clock signal QBCLK. The first inverter 521 may receive an output of the first NAND gate 511 and may invert the output of the first NAND gate 511. The second inverter 522 may receive the second internal clock signal QCLK and may invert the second internal clock signal QCLK. The third inverter 523 may receive an output of the second NAND gate 512 and may invert the output of the second NAND gate 512. The fourth inverter 524 may receive the fourth internal clock signal QBCLK and may invert the fourth internal clock signal QBCLK. The fifth inverter 525 may receive an output of the third NAND gate 513 and may invert the output of the third NAND gate 513. The sixth inverter 526 may receive the third internal clock signal IBCLK and may invert the third internal clock signal IBCLK. The seventh inverter 527 may receive an output of the fourth NAND gate 514 and may invert the output of the fourth NAND gate 514. The eighth inverter 528 may receive the first internal clock signal ICLK and may invert the first internal clock signal ICLK.

The fifth NAND gate 531 may receive outputs of the first inverter 521 and the second inverter 522. The sixth NAND gate 532 may receive outputs of the third inverter 523 and the fourth inverter 524. The seventh NAND gate 533 may receive outputs of the fifth inverter 525 and the sixth inverter 526. The eighth NAND gate 534 may receive outputs of the seventh inverter 527 and the eighth inverter 528. The ninth NAND gate 541 may receive outputs of the fifth NAND gate 531 and the sixth NAND gate 532. The tenth NAND gate 542 may receive outputs of the seventh NAND gate 533 and the eighth NAND gate 534. The ninth inverter 551 may receive the stop signal STOP and may invert the stop signal STOP. The eleventh NAND gate 552 may receive outputs of the ninth NAND gate 541 and the ninth inverter 551. The twelfth NAND gate 553 may receive outputs of the tenth NAND gate 542 and the ninth inverter 551. The thirteenth NAND gate 554 may receive the stop signal STOP and the clock level signal CLK_LV. The AND gate 561 may receive outputs of the eleventh NAND gate 552, the twelfth NAND gate 553 and the thirteenth NAND gate 554 and may generate the complementary data clock driving signal DQSCEN.

TABLE 1

| ICLK | QCLK | IBCLK | QBCLK | DQSTEN | DQSCEN |
|------|------|-------|-------|--------|--------|
| L | L | H | H | L | H |
| H | L | L | H | H | L |
| H | H | L | L | L | H |
| L | H | H | L | H | L |

("L" represents a low logic level and "H" represents a high logic level.)

Table 1 shows operations of the first triggering circuit 310 and the second triggering circuit 320 when the stop signal STOP is disabled. When the stop signal STOP is disabled, the first triggering circuit 310 and the second triggering circuit 320 may periodically enable the data clock driving signal DQSTEN and the complementary data clock driving signal DQSCEN according to logic levels of the first to fourth internal clock signals ICLK, QCLK, IBCLK and QBCLK. When the first internal clock signal ICLK and the second internal clock signal QCLK have a low logic level and the third internal clock signal IBCLK and the fourth internal clock signal QBCLK have a high logic level, the first triggering circuit 310 may disable the data clock driving signal DQSTEN to a low logic level and the second triggering circuit 320 may enable the complementary data clock driving signal DQSCEN to a high logic level. When the first internal clock signal ICLK and the fourth internal clock signal QBCLK have a high logic level and the second internal clock signal QCLK and the third internal clock signal IBCLK have a low logic level, the first triggering circuit 310 may enable the data clock driving signal DQSTEN to a high logic level and the second triggering circuit 320 may disable the complementary data clock driving signal DQSCEN to a low logic level. When the first internal clock signal ICLK and the second internal clock signal QCLK have a high logic level and the third internal clock signal IBCLK and the fourth internal clock signal QBCLK have a low logic level, the first triggering circuit 310 may disable the data clock driving signal DQSTEN to a low logic level and the second triggering circuit 320 may enable the complementary data clock driving signal DQSCEN to a high logic level. When the first internal clock signal ICLK and the fourth internal clock signal QBCLK have a low logic level and the second internal clock signal QCLK and the third internal clock signal IBCLK have a high logic level, the first triggering circuit 310 may enable the data clock driving signal DQSTEN to a high logic level and the second triggering circuit 320 may disable the complementary data clock driving signal DQSCEN to a low logic level.

TABLE 2

| STOP | CLK_LV | DQSTEN | DQSCEN |
|------|--------|--------|--------|
| H | L | L | H |
| H | H | H | L |

("L" represents a low logic level and "H" represents a high logic level.)

Table 2 shows operations of the first triggering circuit 310 and the second triggering circuit 320 when the stop signal STOP is enabled. When the stop signal STOP is enabled, the first triggering circuit 310 and the second triggering circuit 320 may fix the data clock driving signal DQSTEN and the complementary data clock driving signal DQSCEN to particular logic levels according to the clock level signal CLK_LV. When the stop signal STOP is enabled to a high logic level and the clock level signal CLK_LV has a low logic level, the first triggering circuit 310 may fix the data clock driving signal DQSTEN to a low logic level and the second triggering circuit 320 may fix the complementary data dock driving signal DQSCEN to a high logic level. When the stop signal STOP is enabled to a high logic level and the dock level signal CLK_LV has a high logic level, the first triggering circuit 310 may fix the data clock driving signal DQSTEN to a high logic level and the second triggering circuit 320 may fix the complementary data dock driving signal DQSCEN to a low logic level.

Figure 6:
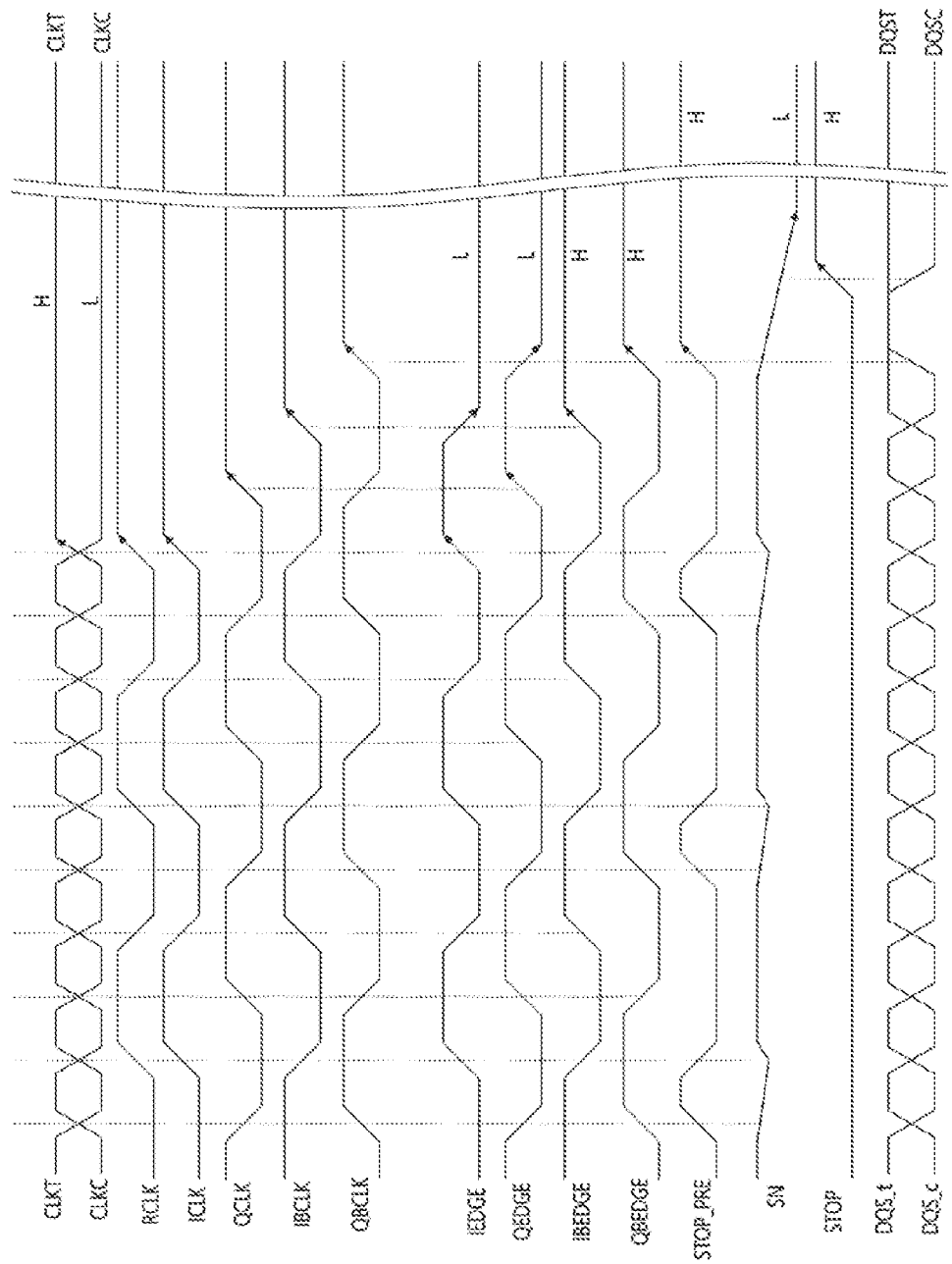
FIGS. 6 and 7 are diagrams illustrating an operation of a semiconductor apparatus according to an embodiment.
Figure 7:
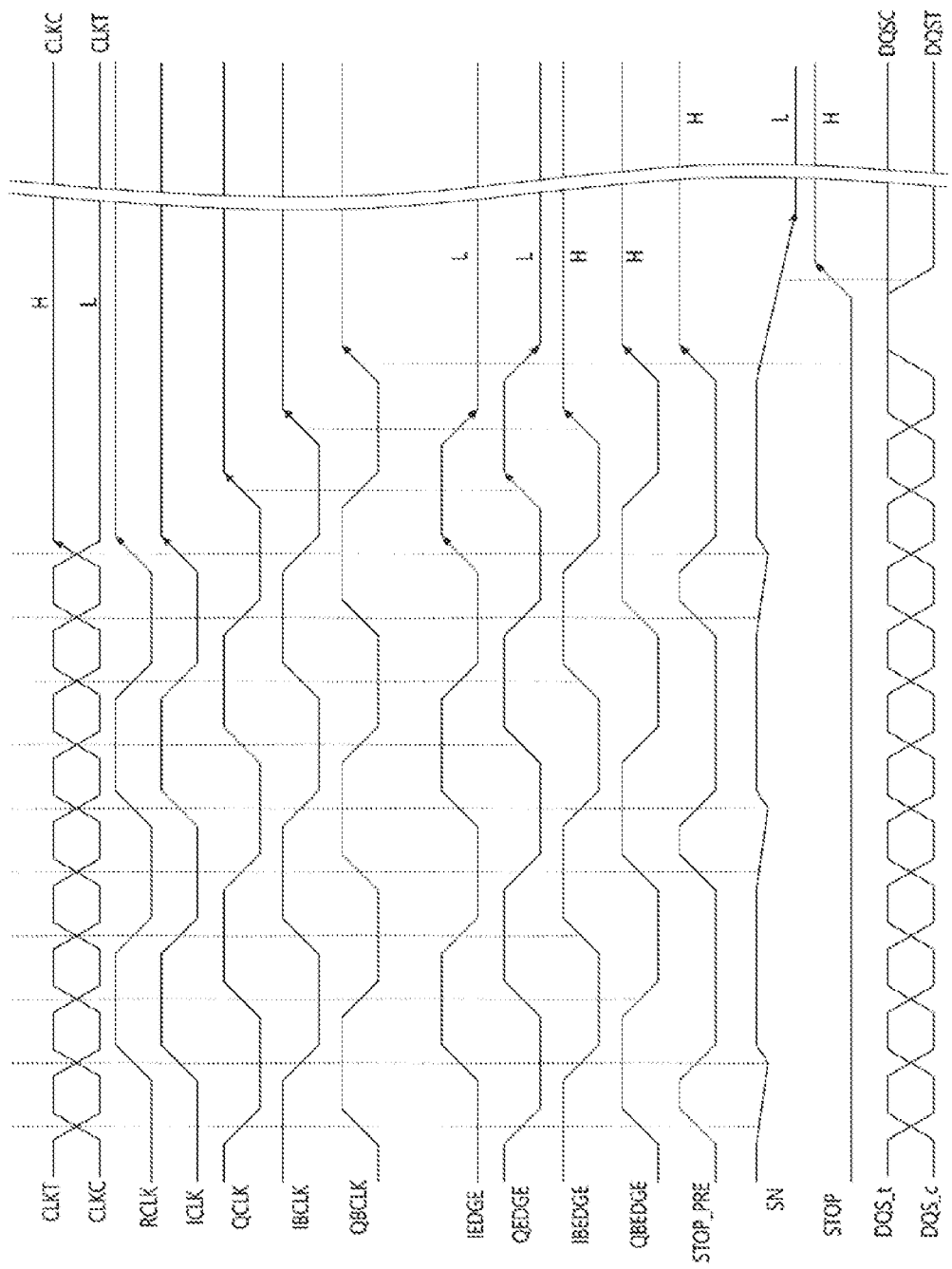

FIGS. 6 and 7 are diagrams illustrating an operation of the semiconductor apparatus 100 according to an embodiment. Hereinafter, described with reference to FIGS. 1 to 7 will be the operation of the semiconductor apparatus 100 according to an embodiment. During a normal operation, the semiconductor apparatus 100 may receive the pair of system clock signals CLKT and CLKC that periodically toggle. A period of the divided reference dock signal RCLKD may be longer than a period of the system clock signal CLKT. For example, the period of the divided reference clock signal RCLKD may be two times longer than the period of the system dock signal CLKT. Propagation delay due to the dock receiver 140 and the dividing circuit 113 will not be illustrated. The internal dock generating circuit 110 may perform a delay-locking operation on the divided reference clock signal RCLKD and may generate the first to fourth internal clock signals ICLK, QCLK, IBCLK and QBCLK sequentially having a phase difference of 90° from each other. When the pair of system clock signals CLKT and CLKC and the reference clock signal RCLK periodically toggle, the first to fourth internal dock signals ICLK, QCLK, IBCLK and QBCLK may also toggle continuously. Although the stop signal generating circuit 120 may periodically enable the preliminary stop signal STOP_PRE based on the first to fourth internal clock signals ICLK, QCLK, IBCLK and QBCLK, a voltage level of the detecting node SN might not change to a low logic level that can be lower than a threshold of the inverter 224 and the stop signal STOP may stay disabled. When the stop signal STOP is in a disabled status, the data clock generating circuit 130 may generate the pair of data clock signals DQST and DQSC, which periodically toggle according to logic levels of the first to fourth internal clock signals ICLK, QCLK, IBCLK and QBCLK. The pair of data clock signals DQST and DQSC may have phases in synchronization with the pair of system clock signals CLKT and CLKC and may have the same period and/or frequency as the pair of system clock signals CLKT and CLKC.

In order to measure the operating resistance value of the semiconductor apparatus 100, the pair of system clock signals CLKT and CLKC may be fixed to particular logic levels. As illustrated in FIG. 6, the system clock signal CLKT may be fixed to a high logic level and the complementary system clock signal CLKC may be fixed to a low logic level. When the system clock signal CLKT is fixed to a high logic level, the reference clock signal RCLK may be fixed to a high logic level in synchronization with the last rising edge of the system clock signal CLKT and the first to fourth internal clock signals ICLK, QCLK, IBCLK and QBCLK may sequentially change to a high logic level. When the first to fourth internal clock signals ICLK, QCLK, IBCLK and QBCLK sequentially change to a high logic level, the preliminary stop signal generator 210 may fix the first edge signal IEDGE and the second edge signal QEDGE to a low logic level, may fix the third edge signal IBEDGE and the fourth edge signal QBEDGE to a high logic level and may keep the preliminary stop signal STOP_PRE enabled. When the preliminary stop signal STOP_PRE stays enabled, the voltage level of the detecting node SN may fall to a sufficiently lower level than the threshold of the inverter 224 and the stop signal STOP may become enabled to a high logic level. When the stop signal STOP is enabled to a high logic level, the gating circuit 122 may provide the system clock signal CLKT as the clock level signal CLK_LV and the clock level signal CLK_LV may have a high logic level. Based on the clock level signal CLK_LV, the data clock generating circuit 130 may fix the data clock driving signal DQSTEN and the data clock signal DQST to a high logic level and may fix the complementary data clock driving signal DQSCEN and the complementary data clock signal DQSC to a low logic level. The pull-up driving force and/or strength and pull-down driving force and/or strength of the data clock transmitter 132 may be determined on the basis of the resistance setting signal RON<1:n>. Therefore, the data clock signal DQST fixed to a high logic level may be a signal, through which the pull-up resistance value of the semiconductor apparatus 100 can be measured, and the complementary data clock signal DQSC fixed to a low logic level may be a signal, through which the pull-down resistance value of the semiconductor apparatus 100 can be measured.

As illustrated in FIG. 7 that is contrary to the illustration of FIG. 6, the system clock signal CLKT may be fixed to a low logic level and the complementary system clock signal CLKC may be fixed to a high logic level. When the system clock signal CLKT is fixed to a low logic level, the reference clock signal RCLK may be fixed to a high logic level in synchronization with the last rising edge of the system clock signal CLKT and the first to fourth internal clock signals ICLK, QCLK, IBCLK and QBCLK may sequentially change to a high logic level. When the first to fourth internal clock signals ICLK, QCLK, IBCLK and QBCLK sequentially change to a high logic level, the preliminary stop signal generator 210 may fix the first edge signal IEDGE and the second edge signal QEDGE to a low logic level, may fix the third edge signal IBEDGE and the fourth edge signal QBEDGE to a high logic level and may keep the preliminary stop signal STOP_PRE enabled. When the preliminary stop signal STOP_PRE stays enabled, the voltage level of the detecting node SN may fall to a sufficiently lower level than the threshold of the inverter 224 and the stop signal STOP may become enabled to a high logic level. When the stop signal STOP is enabled to a high logic level, the gating circuit 122 may provide the system clock signal CLKT as the clock level signal CLK_LV and the dock level signal CLK_LV may have a low logic level. Based on the clock level signal CLK_LV, the data clock generating circuit 130 may fix the data clock driving signal DQSTEN and the data clock signal DQST to a low logic level and may fix the complementary data clock driving signal DQSCEN and the complementary data clock signal DQSC to a high logic level. The pull-up driving force and/or strength and pull-down driving force and/or strength of the data clock transmitter 132 may be determined on the basis of the resistance setting signal RON<1:n>. Therefore, the data clock signal DQST fixed to a low logic level may be a signal, through which the pull-down resistance value of the semiconductor apparatus 100 can be measured, and the complementary data clock signal DQSC fixed to a high logic level may be a signal, through which the pull-up resistance value of the semiconductor apparatus 100 can be measured.

Figure 8:
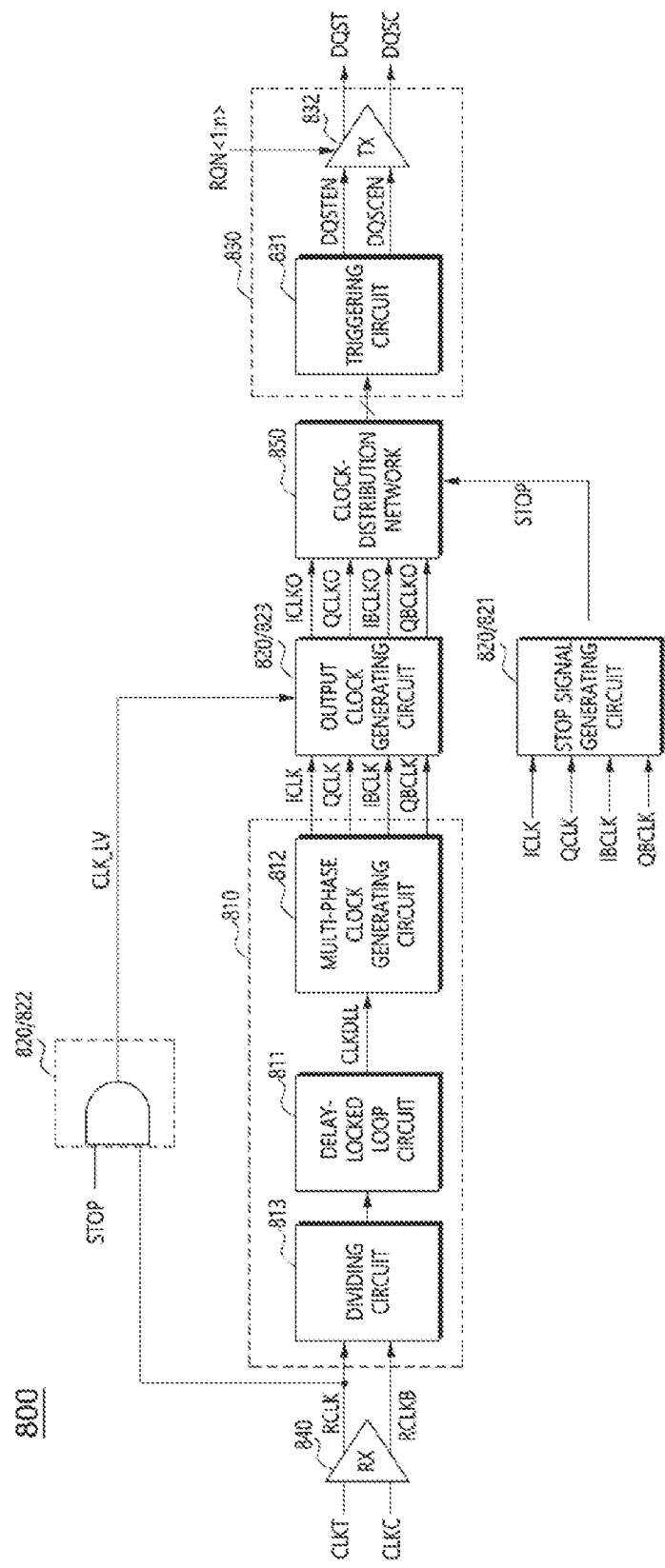
FIG. 8 is a diagram illustrating a configuration of a semiconductor apparatus according to an embodiment.

FIG. 8 is a diagram illustrating a configuration of a semiconductor apparatus 800 according to an embodiment. Referring to FIG. 8, the semiconductor apparatus 800 may include an internal clock generating circuit 810, a stop controlling circuit 820 and a data clock generating circuit 830. The internal clock generating circuit 810 may include a dividing circuit 813, a delay-locked loop circuit 811 and a multi-phase clock generating circuit 812. The data clock generating circuit 830 may include a triggering circuit 831 and a data clock transmitter 832. The semiconductor apparatus 800 may further include a clock receiver 840 and a clock-distribution network 850. The semiconductor apparatus 800 may include the same or similar element as or to the semiconductor apparatus 100 illustrated in FIG. 1 and duplicated description on the same element will be omitted. The stop controlling circuit 820 may receive a plurality of internal clock signals ICLK, QCLK, IBCLK and QBCLK and a reference clock signal RCLK and may generate a plurality of output clock signals ICLKO, QCLKO, IBCLKO and QBCLKO. The stop controlling circuit 820 may generate a stop signal STOP based on the plurality of internal clock signals ICLK, QCLK, IBCLK and QBCLK. The stop controlling circuit 820 may detect logic levels of the plurality of internal clock signals ICLK, QCLK, IBCLK and QBCLK to generate the stop signal STOP. Based on the reference clock signal RCLK and the stop signal STOP, the stop controlling circuit 820 may generate the clock level signal CLK_LV. When the stop signal STOP becomes enabled, the stop controlling circuit 820 may provide the reference clock signal RCLK as the clock level signal CLK_LV. Based on the plurality of internal clock signals ICLK, QCLK, IBCLK and QBCLK, the stop signal STOP and the clock level signal CLK_LV, the stop controlling circuit 820 may generate the plurality of output clock signals ICLKO, QCLKO, IBCLKO and QBCLKO. The plurality of output clock signals ICLKO, QCLKO, IBCLKO and QBCLKO may include a first output clock signal ICLKO, a second output clock signal QCLKO, a third output clock signal IBCLKO and a fourth output clock signal QBCLKO.

The stop controlling circuit 820 may include a stop signal generating circuit 821, a gating circuit 822 and an output clock generating circuit 823. The stop signal generating circuit 821 may receive the plurality of internal clock signals ICLK, QCLK, IBCLK and QBCLK. The stop signal generating circuit 821 may detect the logic levels of the plurality of internal clock signals ICLK, QCLK, IBCLK and QBCLK to generate the stop signal STOP. The stop signal generating circuit 821 may enable the stop signal STOP when all the plurality of internal clock signals ICLK, QCLK, IBCLK and QBCLK have the same logic level. For example, the stop signal generating circuit 821 may enable the stop signal STOP when all the plurality of internal clock signals ICLK, QCLK, IBCLK and QBCLK have a high logic level. When the logic levels of the pair of system clock signals CLKT and CLKC are fixed, all the first to fourth internal clock signals ICLK, QCLK, IBCLK and QBCLK output from the internal clock generating circuit 810 may be fixed to a high logic level. When all the first to fourth internal clock signals ICLK, QCLK, IBCLK and QBCLK have a high logic level, the stop signal generating circuit 821 may detect that the pair of system clock signals CLKT and CLKC stop and may enable the stop signal STOP.

The gating circuit 822 may receive the reference clock signal RCLK and the stop signal STOP. The gating circuit 822 may gate the reference clock signal RCLK based on the stop signal STOP. When the stop signal STOP is in a disabled status, the gating circuit 822 may block the reference clock signal RCLK not to provide the reference clock signal RCLK as the clock level signal CLK_LV. When the stop signal STOP becomes enabled, the gating circuit 822 may provide the reference clock signal RCLK as the clock level signal CLK_LV. The gating circuit 822 may include an AND gate. The AND gate may receive the reference clock signal RCLK and the stop signal STOP and may perform an AND operation on the reference clock signal RCLK and the stop signal STOP to output the clock level signal CLK_LV.

The output clock generating circuit 823 may receive the stop signal STOP, the clock level signal CLK_LV and the plurality of internal clock signals ICLK, QCLK, IBCLK and QBCLK. When the stop signal STOP is in a disabled status, the output clock generating circuit 823 may provide the plurality of internal clock signals ICLK, QCLK, IBCLK and QBCLK as the plurality of output clock signals ICLKO, QCLKO, IBCLKO and QBCLKO. For example, the output clock generating circuit 823 may provide the first internal clock signal ICLK as the first output clock signal ICLKO, may provide the second internal clock signal QCLK as the second output clock signal QCLKO, may provide the third internal clock signal IBCLK as the third output clock signal IBCLKO and may provide the fourth internal clock signal QBCLK as the fourth output clock signal QBCLKO. When the stop signal STOP becomes enabled, the output clock generating circuit 823 may fix the plurality of output clock signals ICLKO, QCLKO, IBCLKO and QBCLKO to particular logic levels based on the clock level signal CLK_LV. For example, the output clock generating circuit 823 may fix the first internal clock signal ICLK and the third internal clock signal IBCLK to a logic level corresponding to the clock level signal CLK_LV and may fix the second internal clock signal QCLK and the fourth internal clock signal QBCLK to a logic level opposite to the clock level signal CLK_LV. When the clock level signal CLK_LV has a high logic level, the output clock generating circuit 823 may fix the first output clock signal ICLKO and the third output clock signal IBCLKO to a high logic level and may fix the second output clock signal QCLKO and the fourth output clock signal QBCLKO to a low logic level. When the clock level signal CLK_LV has a low logic level, the output clock generating circuit 823 may fix the first output clock signal ICLKO and the third output clock signal IBCLKO to a low logic level and may fix the second output clock signal QCLKO and the fourth output clock signal QBCLKO to a high logic level.

The clock-distribution network 850 may be coupled to the output clock generating circuit 823 and may receive the plurality of output clock signals ICLKO, QCLKO, IBCLKO and QBCLKO. The clock-distribution network 850 may drive the plurality of output clock signals ICLKO, QCLKO, IBCLKO and QBCLKO to provide the data clock generating circuit 830 with the plurality of output clock signals ICLKO, QCLKO, IBCLKO and QBCLKO. Based on the plurality of output clock signals ICLKO, QCLKO, IBCLKO and QBCLKO, the data clock generating circuit 830 may generate data clock signal DQST and complementary data clock signal DQSC.

Figure 9:
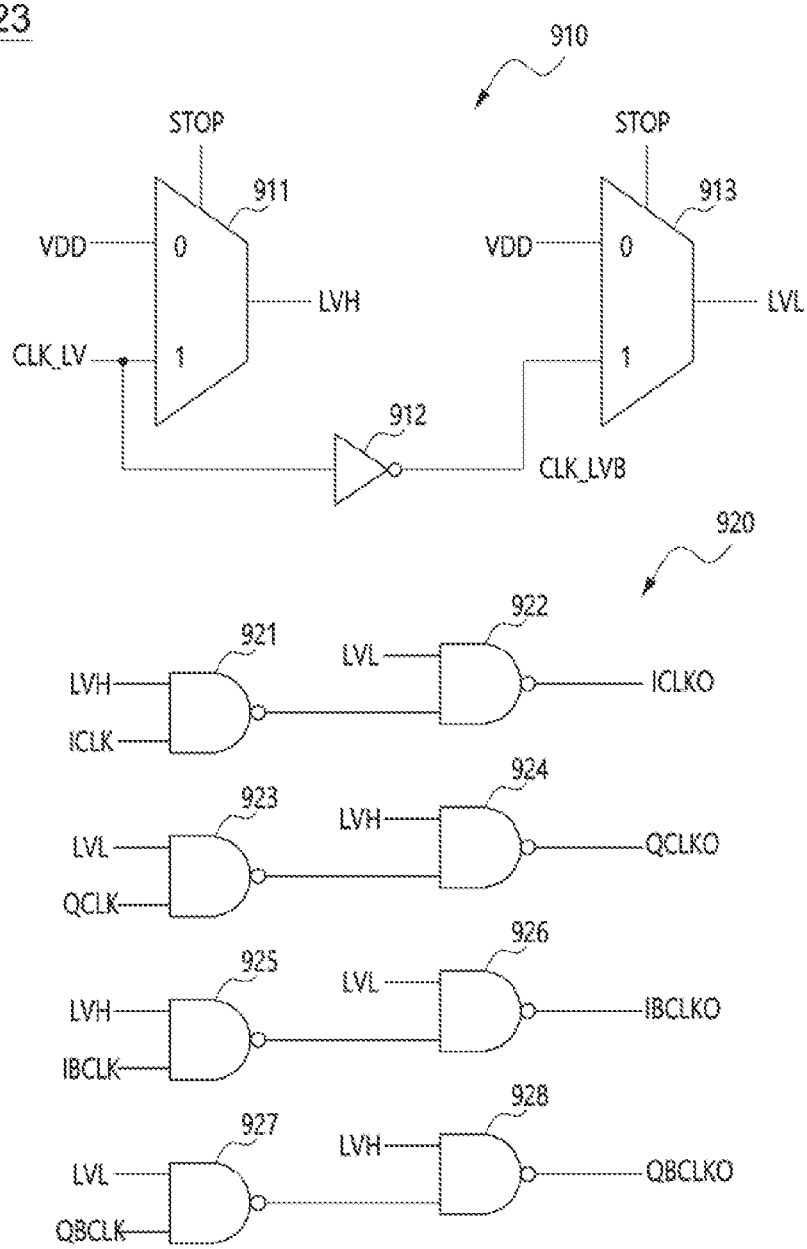
FIG. 9 is a diagram illustrating a configuration of an output clock generating circuit illustrated in FIG. 8.

FIG. 9 is a diagram illustrating a configuration of the output clock generating circuit 823 illustrated in FIG. 8. Referring to FIG. 9, the output clock generating circuit 823 may include a level signal generator 910 and an output clock driver 920. The level signal generator 910 may receive the stop signal STOP and the clock level signal CLK_LV and may generate a first level signal LVH and a second level signal LVL based on the stop signal STOP and the clock level signal CLK_LV. When the stop signal STOP becomes disabled, the level signal generator 910 may fix the first level signal LVH and the second level signal LVL to the same logic level. For example, the generator 910 may fix the first level signal LVH and the second level signal LVL to a high logic level. When the stop signal STOP becomes enabled, the level signal generator 910 may fix the first level signal LVH and the second level signal LVL to different logic levels from each other according to the clock level signal CLK_LV. When the clock level signal CLK_LV has a high logic level, the level signal generator 910 may fix the first level signal LVH to a high logic level and may fix the second level signal LVL to a low logic level. When the clock level signal CLK_LV has a low logic level, the level signal generator 910 may fix the first level signal LVH to a low logic level and may fix the second level signal LVL to a high logic level.

The level signal generator 910 may include a first multiplexer 911, an inverter 912 and a second multiplexer 913. The first multiplexer 911 may receive a first power voltage VDD, the clock level signal CLK_LV and the stop signal STOP. Based on the stop signal STOP, the first multiplexer 911 may output, as the first level signal LVH, one of the first power voltage VDD and the clock level signal CLK_LV. When the stop signal STOP becomes disabled, the first multiplexer 911 may output the first power voltage VDD as the first level signal LVH. When the stop signal STOP becomes enabled, the first multiplexer 911 may output the clock level signal CLK_LV as the first level signal LVH. The inverter 912 may receive the clock level signal CLK_LV and may invert the clock level signal CLK_LV to output a complementary clock level signal CLK_LVB. The second multiplexer 913 may receive the first power voltage VDD, the output of the inverter 912 and the stop signal STOP. Based on the stop signal STOP, the second multiplexer 913 may output, as the second level signal LVL, one of the first power voltage VDD and the complementary clock level signal CLK_LVB. When the stop signal STOP becomes disabled, the second multiplexer 913 may output the first power voltage VDD as the second level signal LVL. When the stop signal STOP becomes enabled, the second multiplexer 913 may output the complementary clock level signal CLK_LVB as the second level signal LVL.

The output clock driver 920 may receive the plurality of internal clock signals ICLK, QCLK, IBCLK and QBCLK, the first level signal LVH and the second level signal LVL. The output clock driver 920 may generate the plurality of output clock signals ICLKO, QCLKO, IBCLKO and QBCLKO based on the plurality of internal clock signals ICLK, QCLK, IBCLK and QBCLK, the first level signal LVH and the second level signal LVL. The output clock driver 920 may generate the first output clock signal ICLKO based on the first internal clock signal ICLK, the first level signal LVH and the second level signal LVL. When the first level signal LVH and the second level signal LVL are fixed to the same logic level, the output clock driver 920 may provide the first internal clock signal ICLK as the first output clock signal ICLKO. When the first level signal LVH and the second level signal LVL have different logic levels from each other, the output clock driver 920 may fix the first output clock signal ICLKO to one of a high logic level and a low logic level. The output clock driver 920 may generate the second output clock signal QCLKO based on the second internal clock signal QCLK, the first level signal LVH and the second level signal LVL. When the first level signal LVH and the second level signal LVL are fixed to the same logic level, the output clock driver 920 may provide the second internal clock signal QCLK as the second output clock signal QCLKO. When the first level signal LVH and the second level signal LVL have different logic levels from each other, the output clock driver 920 may fix the second output clock signal QCLKO to one of a high logic level and a low logic level. The output clock driver 920 may generate the third output clock signal IBCLKO based on the third internal clock signal IBCLK, the first level signal LVH and the second level signal LVL. When the first level signal LVH and the second level signal LVL are fixed to the same logic level, the output clock driver 920 may provide the third internal clock signal IBCLK as the third output clock signal IBCLKO. When the first level signal LVH and the second level signal LVL have different logic levels from each other, the output clock driver 920 may fix the third output clock signal IBCLKO to one of a high logic level and a low logic level. The output clock driver 920 may generate the fourth output clock signal QBCLKO based on the fourth internal clock signal QBCLK, the first level signal LVH and the second level signal LVL. When the first level signal LVH and the second level signal LVL are fixed to the same logic level, the output clock driver 920 may provide the fourth internal clock signal QBCLK as the fourth output clock signal QBCLKO. When the first level signal LVH and the second level signal LVL have different logic levels from each other, the output clock driver 920 may fix the fourth output clock signal QBCLKO to one of a high logic level and a low logic level.

The output clock driver 920 may include a first NAND gate 921, a second NAND gate 922, a third NAND gate 923, a fourth NAND gate 924, a fifth NAND gate 925, a sixth NAND gate 926, a seventh NAND gate 927 and an eighth NAND gate 928. The first NAND gate 921 may receive the first level signal LVH and the first internal clock signal ICLK. The second NAND gate 922 may receive the second level signal LVL and an output of the first NAND gate 921 to output the first output clock signal ICLKO. The third NAND gate 923 may receive the first level signal LVH and the second internal clock signal QCLK. The fourth NAND gate 924 may receive the second level signal LVL and an output of the third NAND gate 923 to output the second output clock signal QCLKO. The fifth NAND gate 925 may receive the first level signal LVH and the third internal clock signal IBCLK. The sixth NAND gate 926 may receive the second level signal LVL and an output of the fifth NAND gate 925 to output the third output clock signal IBCLKO. The seventh NAND gate 927 may receive the first level signal LVH and the fourth internal clock signal QBCLK. The eighth NAND gate 928 may receive the second level signal LVL and an output of the seventh NAND gate 927 to output the fourth output clock signal QBCLKO.

Figure 10:
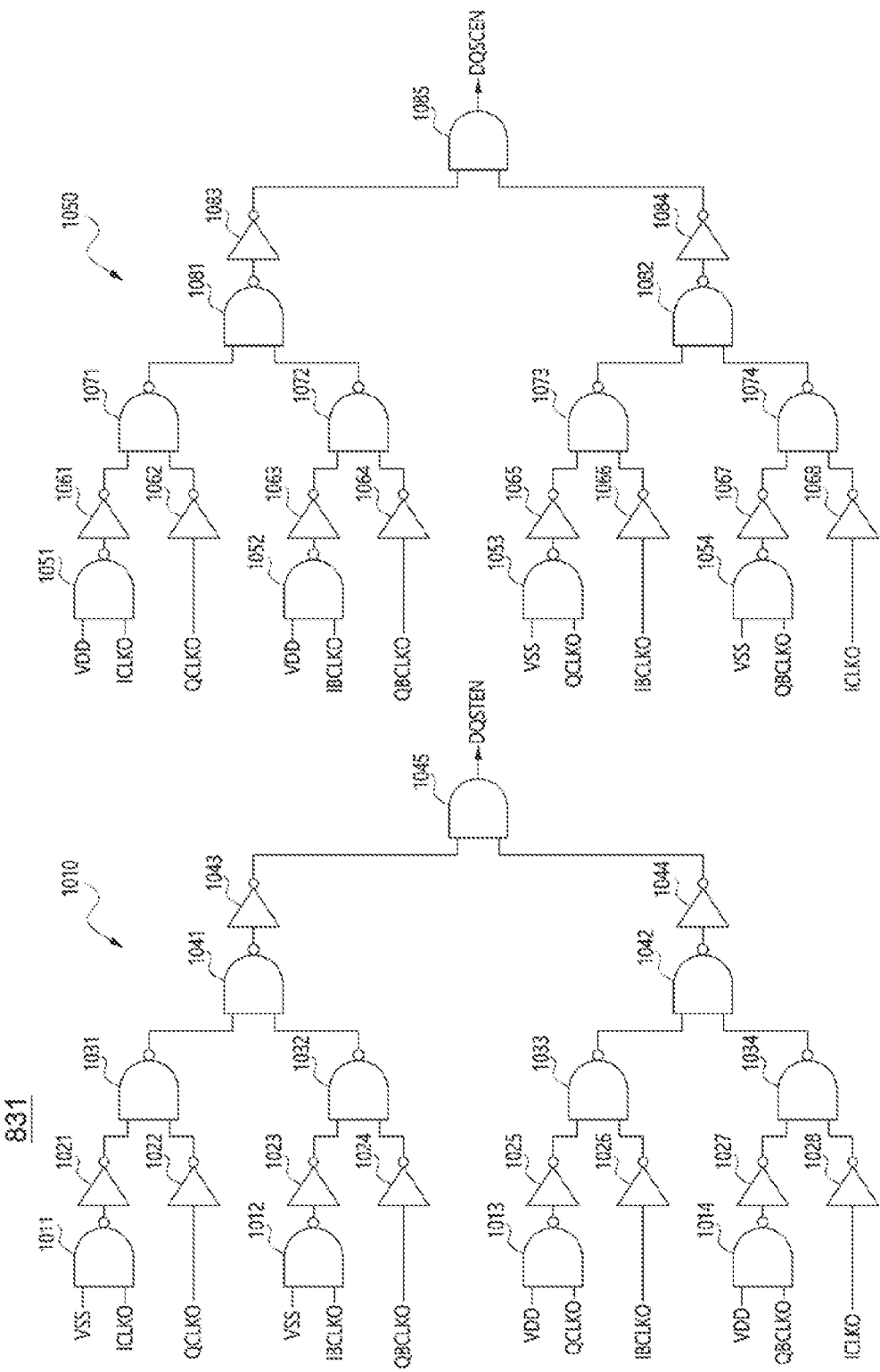
FIG. 10 is a diagram illustrating a configuration of a triggering circuit illustrated in FIG. 8.

FIG. 10 is a diagram illustrating a configuration of a triggering circuit 831 illustrated in FIG. 8. Referring to FIG. 10, the triggering circuit 831 may include a first triggering circuit 1010 and a second triggering circuit 1050. The first triggering circuit 1010 may receive the plurality of output clock signals ICLKO, QCLKO, IBCLKO and QBCLKO and may generate a data dock driving signal DQSTEN based on the plurality of output clock signals ICLKO, QCLKO, IBCLKO and QBCLKO. The second triggering circuit 1050 may receive the plurality of output clock signals ICLKO, QCLKO, IBCLKO and QBCLKO and may generate a complementary data clock driving signal DQSCEN based on the plurality of output clock signals ICLKO, QCLKO, IBCLKO and QBCLKO. The first triggering circuit 1010 and the second triggering circuit 1050 may receive the plurality of output dock signals ICLKO, QCLKO, IBCLKO and QBCLKO generated from the output clock generating circuit 823 and therefore need not receive the stop signal STOP and the dock level signal CLK_LV.

The first triggering circuit 1010 may include a first NAND gate 1011, a second NAND gate 1012, a third NAND gate 1013, a fourth NAND gate 1014, a first inverter 1021, a second inverter 1022, a third inverter 1023, a fourth inverter 1024, a fifth inverter 1025, a sixth inverter 1026, a seventh inverter 1027, an eighth inverter 1028, a fifth NAND gate 1031, a sixth NAND gate 1032, a seventh NAND gate 1033, an eighth NAND gate 1034, a ninth NAND gate 1041, a tenth NAND gate 1042, a ninth inverter 1043, a tenth inverter 1044 and an AND gate 1045. The first NAND gate 1011 may receive a second power voltage VSS and the first output clock signal ICLKO. The second NAND gate 1012 may receive the second power voltage VSS and the third output clock signal IBCLKO. The third NAND gate 1013 may receive the first power voltage VDD and the second output clock signal QCLKO. The fourth NAND gate 1014 may receive the first power voltage VDD and the fourth output clock signal QBCLKO. The first inverter 1021 may receive an output of the first NAND gate 1011 and may invert the output of the first NAND gate 1011. The second inverter 1022 may receive the second output clock signal QCLKO and may invert the second output clock signal QCLKO. The third inverter 1023 may receive an output of the second NAND gate 1012 and may invert the output of the second NAND gate 1012. The fourth inverter 1024 may receive the fourth output clock signal QBCLKO and may invert the fourth output clock signal QBCLKO. The fifth inverter 1025 may receive an output of the third NAND gate 1013 and may invert the output of the third NAND gate 1013. The sixth inverter 1026 may receive the third output clock signal IBCLKO and may invert the third output clock signal IBCLKO. The seventh inverter 1027 may receive an output of the fourth NAND gate 1014 and may invert the output of the fourth NAND gate 1014. The eighth inverter 1028 may receive the first output clock signal ICLKO and may invert the first output clock signal ICLKO.

The fifth NAND gate 1031 may receive outputs of the first inverter 1021 and the second inverter 1022. The sixth NAND gate 1032 may receive outputs of the third inverter 1023 and the fourth inverter 1024. The seventh NAND gate 1033 may receive outputs of the fifth inverter 1025 and the sixth inverter 1026. The eighth NAND gate 1034 may receive outputs of the seventh inverter 1027 and the eighth inverter 1028. The ninth NAND gate 1041 may receive outputs of the fifth NAND gate 1031 and the sixth NAND gate 1032. The tenth NAND gate 1042 may receive outputs of the seventh NAND gate 1033 and the eighth NAND gate 1034. The ninth inverter 1043 may receive an output of the ninth NAND gate 1041 and may invert the output of the ninth NAND gate 1041. The tenth inverter 1044 may receive an output of the tenth NAND gate 1042 and may invert the output of the tenth NAND gate 1042. The AND gate 1045 may receive outputs of the ninth inverter 1043 and the tenth inverter 1044 and may generate the data dock driving signal DQSTEN.

The second triggering circuit 1050 may include a first NAND gate 1051, a second NAND gate 1052, a third NAND gate 1053, a fourth NAND gate 1054, a first inverter 1061, a second inverter 1062, a third inverter 1063, a fourth inverter 1064, a fifth inverter 1065, a sixth inverter 1066, a seventh inverter 1067, an eighth inverter 1068, a fifth NAND gate 1071, a sixth NAND gate 1072, a seventh NAND gate 1073, an eighth NAND gate 1074, a ninth NAND gate 1081, a tenth NAND gate 1082, a ninth inverter 1083, a tenth inverter 1084 and an AND gate 1085. The first NAND gate 1051 may receive a first power voltage VDD and the first output clock signal ICLKO. The second NAND gate 1052 may receive the first power voltage VDD and the third output clock signal IBCLKO. The third NAND gate 1053 may receive the second power voltage VSS and the second output clock signal QCLKO. The fourth NAND gate 1054 may receive the second power voltage VSS and the fourth output dock signal QBCLKO. The first inverter 1061 may receive an output of the first NAND gate 1051 and may invert the output of the first NAND gate 1051. The second inverter 1062 may receive the second output clock signal QCLKO and may invert the second output clock signal QCLKO. The third inverter 1063 may receive an output of the second NAND gate 1052 and may invert the output of the second NAND gate 1052. The fourth inverter 1064 may receive the fourth output clock signal QBCLKO and may invert the fourth output clock signal QBCLKO. The fifth inverter 1065 may receive an output of the third NAND gate 1053 and may invert the output of the third NAND gate 1053. The sixth inverter 1066 may receive the third output clock signal IBCLKO and may invert the third output clock signal IBCLKO. The seventh inverter 1067 may receive an output of the fourth NAND gate 1054 and may invert the output of the fourth NAND gate 1054. The eighth inverter 1068 may receive the first output clock signal ICLKO and may invert the first output clock signal ICLKO.

The fifth NAND gate 1071 may receive outputs of the first inverter 1061 and the second inverter 1062. The sixth NAND gate 1072 may receive outputs of the third inverter 1063 and the fourth inverter 1064. The seventh NAND gate 1073 may receive outputs of the fifth inverter 1065 and the sixth inverter 1066. The eighth NAND gate 1074 may receive outputs of the seventh inverter 1067 and the eighth inverter 1068. The ninth NAND gate 1081 may receive outputs of the fifth NAND gate 1071 and the sixth NAND gate 1072. The tenth NAND gate 1082 may receive outputs of the seventh NAND gate 1073 and the eighth NAND gate 1074. The ninth inverter 1083 may receive an output of the ninth NAND gate 1081 and may invert the output of the ninth NAND gate 1081. The tenth inverter 1084 may receive an output of the tenth NAND gate 1082 and may invert the output of the tenth NAND gate 1082. The AND gate 1085 may receive outputs of the ninth inverter 1083 and the tenth inverter 1084 and may generate the complementary data dock driving signal DQSCEN.

When the first output clock signal ICLKO and the second output clock signal QCLKO have a low logic level and the third output clock signal IBCLKO and the fourth output clock signal QBCLKO have a high logic level, the first triggering circuit 1010 may disable the data dock driving signal DQSTEN to a low logic level and the second triggering circuit 1050 may enable the complementary data dock driving signal DQSCEN to a high logic level. When the first output clock signal ICLKO and the fourth output clock signal QBCLKO have a high logic level and the second output clock signal QCLKO and the third output clock signal IBCLKO have a low logic level, the first triggering circuit 1010 may enable the data dock driving signal DQSTEN to a high logic level and the second triggering circuit 1050 may disable the complementary data clock driving signal DQSCEN to a low logic level. When the first output clock signal ICLKO and the second output clock signal QCLKO have a high logic level and the third output clock signal IBCLKO and the fourth output clock signal QBCLKO have a low logic level, the first triggering circuit 1010 may disable the data clock driving signal DQSTEN to a low logic level and the second triggering circuit 1050 may enable the complementary data clock driving signal DQSCEN to a high logic level. When the first output clock signal ICLKO and the fourth output clock signal QBCLKO have a low logic level and the second output clock signal QCLKO and the third output clock signal IBCLKO have a high logic level, the first triggering circuit 1010 may enable the data clock driving signal DQSTEN to a high logic level and the second triggering circuit 1050 may disable the complementary data clock driving signal DQSCEN to a low logic level. When the first output clock signal ICLKO and the third output clock signal IBCLKO have a high logic level and the second output clock signal QCLKO and the fourth output clock signal QBCLKO have a low logic level, the first triggering circuit 1010 enable the data clock driving signal DQSTEN to a high logic level and the second triggering circuit 1050 may disable the complementary data clock driving signal DQSCEN to a low logic level. When the first output clock signal ICLKO and the third output clock signal IBCLKO have a low logic level and the second output clock signal QCLKO and the fourth output clock signal QBCLKO have a high logic level, the first triggering circuit 1010 disable the data clock driving signal DQSTEN to a low logic level and the second triggering circuit 1050 may enable the complementary data dock driving signal DQSCEN to a high logic level.

Figure 11:
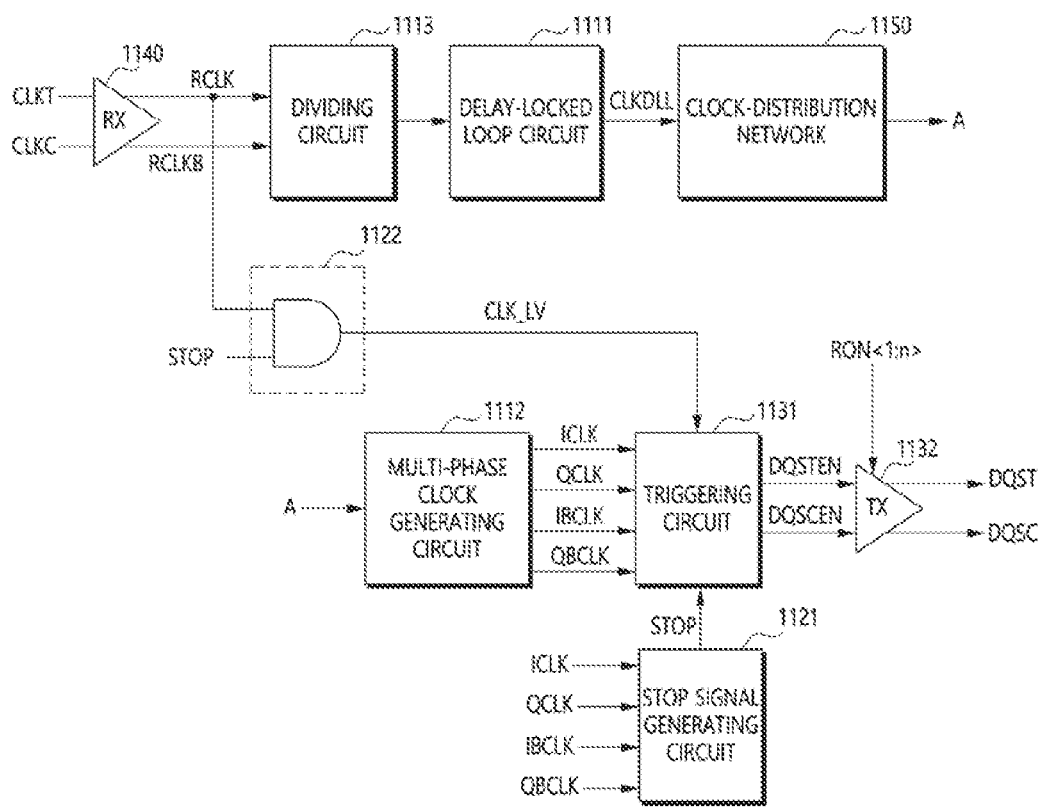
FIG. 11 is a diagram illustrating a configuration of a semiconductor apparatus according to an embodiment.

FIG. 11 is a diagram illustrating a configuration of a semiconductor apparatus 1100 according to an embodiment. Referring to FIG. 11, the semiconductor apparatus 1100 may include a dock receiver (RX) 1140, a dividing circuit 1113, a delay-locked loop circuit 1111, a dock-distribution network 1150, a mufti-phase clock generating circuit 1112, a stop signal generating circuit 1121, a gating circuit 1122, a triggering circuit 1131 and a data dock transmitter (TX) 1132. Except connection relationships of some dements, the semiconductor apparatus 1100 may have the same configuration as the semiconductor apparatus 100 illustrated in FIG. 1. Within the semiconductor apparatus 1100, the dock-distribution network 1150 may be coupled between the delay-locked loop circuit 1111 and the multi-phase clock generating circuit 1112. The dock-distribution network 1150 may receive the delay-locked clock signal CLKDLL generated from the delay-locked loop circuit 1111. The dock-distribution network 1150 may drive the delay-locked dock signal CLKDLL to provide the delay-locked clock signal CLKDLL to the mufti-phase clock signal generating circuit 1112 as denoted by 'A' in the figure. The mufti-phase clock generating circuit 1112 may receive the delay-locked clock signal CLKDLL and may generate the plurality of internal clock signals ICLK, QCLK, IBCLK and QBCLK based on the delay-locked clock signal CLKDLL. The triggering circuit 1131 may receive the plurality of internal clock signal ICLK, QCVLK, IBCLK, QBCLK from the multi-phase clock generating circuit 1112.

Figure 12:
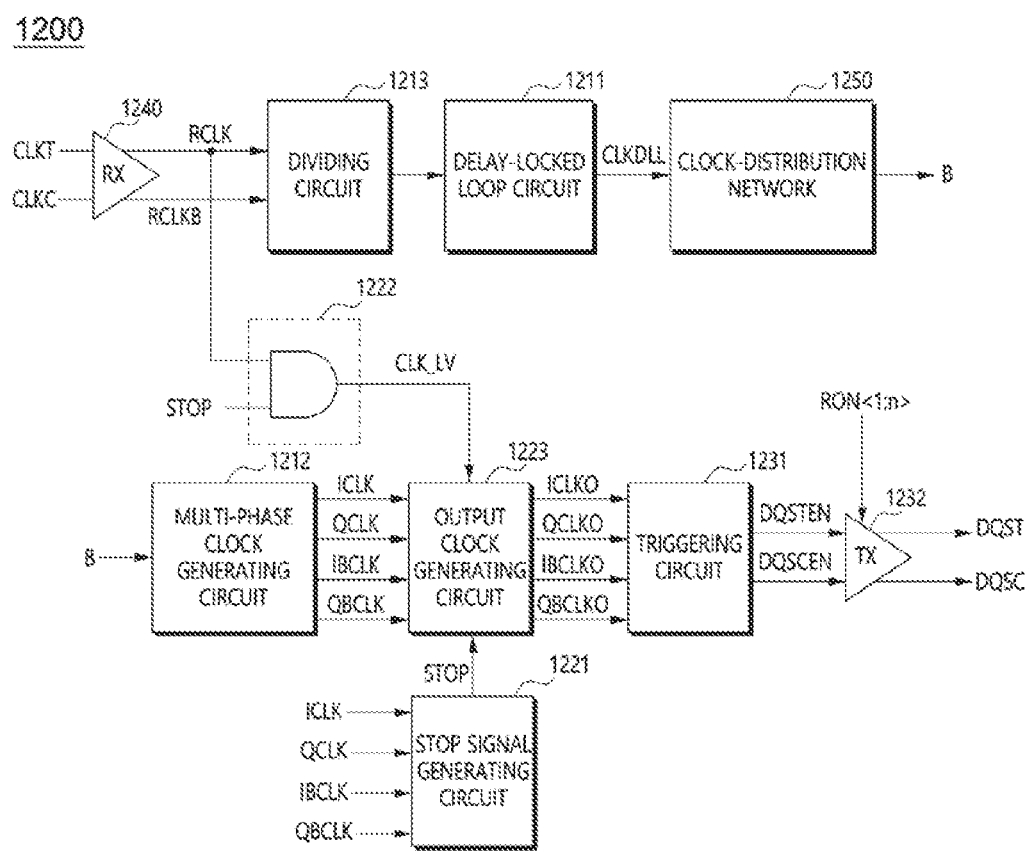
FIG. 12 is a diagram illustrating a configuration of a semiconductor apparatus according to an embodiment.

FIG. 12 is a diagram illustrating a configuration of a semiconductor apparatus 1200 according to an embodiment. Referring to FIG. 12, the semiconductor apparatus 1200 may include a dock receiver (RX) 1240, a dividing circuit 1213, a delay-locked loop circuit 1211, a clock-distribution network 1250, a multi-phase clock generating circuit 1212, a stop signal generating circuit 1221, a gating circuit 1222, an output clock generating circuit 1223, a triggering circuit 1231 and a data clock transmitter (TX) 1232. Except connection relationships of some elements, the semiconductor apparatus 1200 may have the same configuration as the semiconductor apparatus 800 illustrated in FIG. 8. Within the semiconductor apparatus 1200, the clock-distribution network 1250 may be coupled between the delay-locked loop circuit 1211 and the multi-phase clock generating circuit 1212. The clock-distribution network 1250 may receive the delay-locked clock signal CLKDLL generated from the delay-locked loop circuit 1211. The clock-distribution network 1250 may drive the delay-locked clock signal CLKDLL to provide the delay-locked clock signal CLKDLL to the multi-phase clock signal generating circuit 1212 as denoted by 'B' in the figure. The multi-phase clock generating circuit 1212 may receive the delay-locked clock signal CLKDLL and may generate the plurality of internal clock signals ICLK, QCLK, IBCLK and QBCLK based on the delay-locked clock signal CLKDLL.

Figure 13:
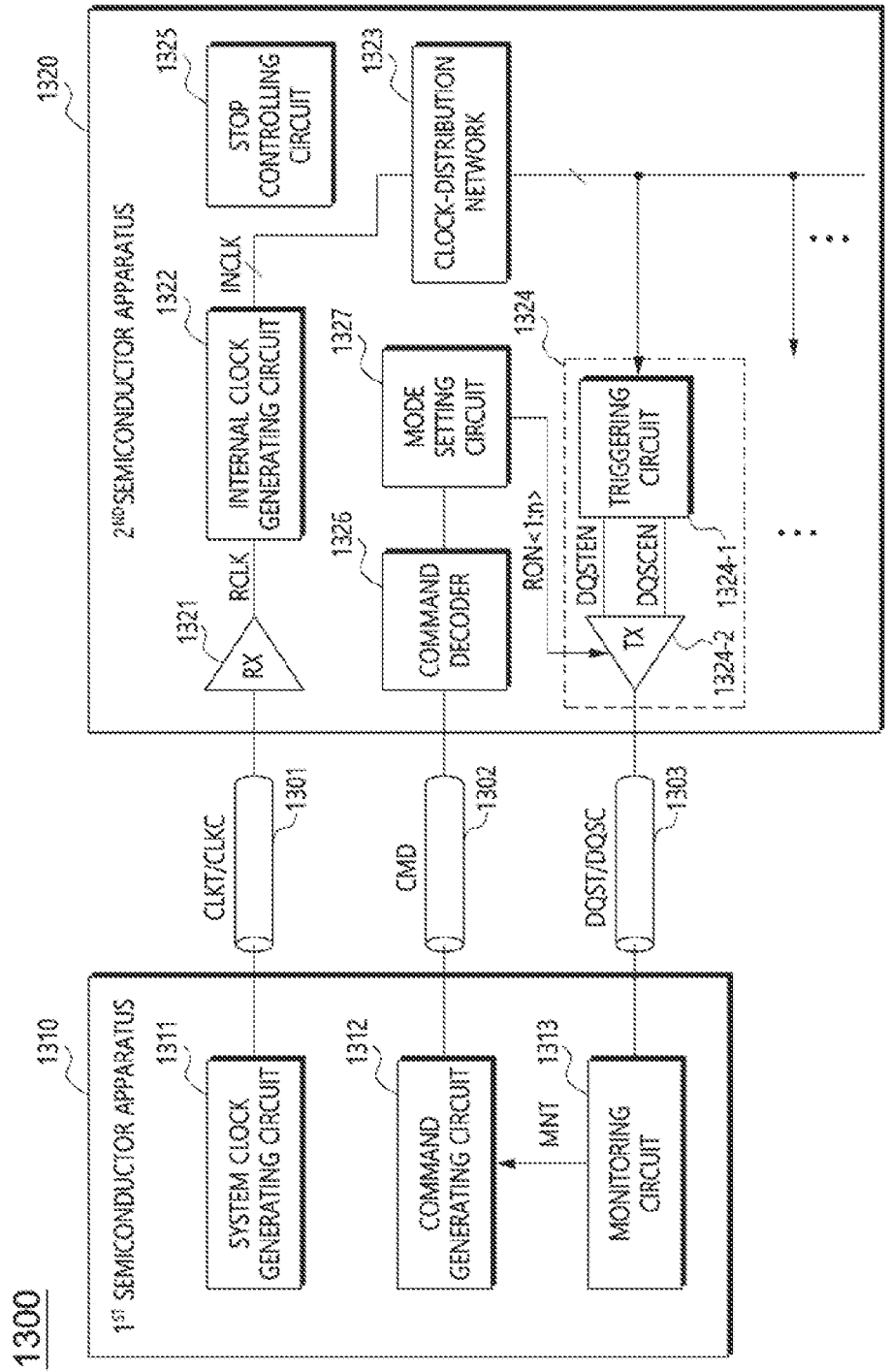
FIG. 13 is a diagram illustrating a configuration of a semiconductor system according to an embodiment.

FIG. 13 is a diagram illustrating a configuration of a semiconductor system 1300 according to an embodiment. Referring to FIG. 13, the semiconductor system 1300 may include a first semiconductor apparatus 1310 and a second semiconductor apparatus 1320. The first semiconductor apparatus 1310 may provide various control signals required for the second semiconductor apparatus 1320 to operate. The first semiconductor apparatus 1310 may include various types of host devices. For example, the first semiconductor apparatus 1310 may include at least one of a central processing unit (CPU), a graphic processing unit (GPU), a multi-media processor (MMP), a digital signal processor, an application processor (AP) and a memory controller. For example, the second semiconductor apparatus 1320 may be a memory device and the memory device may include a volatile memory and a nonvolatile memory. The volatile memory may include a static random access memory (static RAM: SRAM), a dynamic RAM (DRAM) and a synchronous DRAM (SDRAM). The nonvolatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The second semiconductor apparatus 1320 may be coupled to the first semiconductor apparatus 1310 through a plurality of buses. The plurality of buses may be a signal transmission path, a link or a channel for transferring a signal. The plurality of buses may include a system dock bus 1301, a command bus 1302 and a data dock bus 1303. Each of the system dock bus 1301 and the command bus 1302 may be a one-way bus and the data dock bus 1303 may be a two-way bus. The second semiconductor apparatus 1320 may be coupled to the first semiconductor apparatus 1310 through the system dock bus 1301 and may receive a system dock signal CLKT from the first semiconductor apparatus 1310 through the system dock bus 1301. The system clock signal CLKT may be transmitted together with a complementary system clock signal CLKC. The second semiconductor apparatus 1320 may be coupled to the first semiconductor apparatus 1310 through the command bus 1302 and may receive a command signal CMD from the first semiconductor apparatus 1310 through the command bus 1302. The second semiconductor apparatus 1320 may be synchronized with the system clock signal CLKT to receive the command signal CMD. The second semiconductor apparatus 1320 may be coupled to the first semiconductor apparatus 1310 through the data dock bus 1303. The second semiconductor apparatus 1320 may receive a pair of data clock signals DQST and DQSC from the first semiconductor apparatus 1310 or may transmit the pair of data clock signals DQST and DQSC to the first semiconductor apparatus 1310, through the data dock bus 1303.

The first semiconductor apparatus 1310 may include a system clock generating circuit 1311, a command generating circuit 1312 and a monitoring circuit 1313. The system clock generating circuit 1311 may generate the pair of system clock signals CLKT and CLKC. The system clock generating circuit 1311 may include a periodic signal generating circuit and may generate the pair of system clock signals CLKT and CLKC that toggle at a predetermined period. The system clock generating circuit 1311 may be implemented with a clock generating circuit such as an oscillating circuit, a phase-locked loop circuit and so forth. Through the system clock bus 1301, the system clock generating circuit 1311 may provide the second semiconductor apparatus 1320 with the pair of system clock signals CLKT and CLKC. The command generating circuit 1312 may generate various command signals for the second semiconductor apparatus 1320 to perform various operations. The various command signals may include an active command signal, a read command signal, a write command signal, a refresh command signal and so forth. In order to set an operation parameter of the second semiconductor apparatus 1320, the command generating circuit 1312 may generate a command signal CMD including information on the operation parameter. Through the command bus 1302, the command generating circuit 1312 may provide the second semiconductor apparatus 1320 with the command signal CMD. The monitoring circuit 1313 may be coupled to the data clock bus 1303 and may receive, through the data clock bus 1303, the pair of data clock signals DQST and DQSC provided from the second semiconductor apparatus 1320. The monitoring circuit 1313 may monitor voltage levels of the pair of data clock signals DQST and DQSC and may provide the command generating circuit 1312 with a result MNT of the monitoring. When receiving the pair of data clock signals DQST and DQSC fixed to different logic levels, the monitoring circuit 1313 may detect the voltage levels of the pair of data clock signals DQST and DQSC. The command generating circuit 1312 may receive the result MNT of the monitoring from the monitoring circuit 1313 and may generate the command signal CMD for setting the operation parameter of the second semiconductor apparatus 1320.

The second semiconductor apparatus 1320 may include a clock receiver (RX) 1321, an internal clock generating circuit 1322, a clock-distribution network 1323, a data clock generating circuit 1324, a stop controlling circuit 1325, a command decoder 1326 and a mode setting circuit 1327. The clock receiver 1321 may be coupled to the system clock bus 1301 and may receive, through the system clock bus 1301, the pair of system clock signals CLKT and CLKC. The clock receiver 1321 may buffer the pair of system clock signals CLKT and CLKC to generate a reference clock signal RCLK. The internal clock generating circuit 1322 may receive the reference clock signal RCLK and may generate, based on the reference clock signal RCLK, a plurality of internal clock signals INCLK having different phases. The clock-distribution network 1323 may receive the plurality of internal clock signals INCLK generated from the internal clock signal generating circuit 1322. The clock-distribution network 1323 may drive the plurality of internal clock signals INCLK and may provide the data clock generating circuit 1324 with the driven clock signals.

The data clock generating circuit 1324 may receive the clock signals provided from the dock-distribution network 1323 and may generate the pair of data clock signals DQST and DQSC based on the received clock signals. The data clock generating circuit 1324 may include a triggering circuit 1324-1 and a data clock transmitter (TX) 1324-2. The triggering circuit 1324-1 may generate a data clock driving signal DQSTEN and a complementary data clock driving signal DQSCEN based on the clock signals from the clock-distribution network 1323. The data clock transmitter 1324-2 may generate the data clock signal DQST based on the data clock driving signal DQSTEN and may generate the complementary data clock signal DQSC based on the complementary data clock driving signal DQSCEN. The data clock transmitter 1324-2 may receive a resistance setting signal RON<1:n> and may set, based on the resistance setting signal RON<1:n>, driving force and/or strength for driving the data clock signal DQST and the complementary data clock signal DQSC.

When the pair of system clock signals CLKT and CLKC stop, the stop controlling circuit 1325 may fix the pair of data clock signals DQST and DQSC to different logic levels. The stop controlling circuit 1325 may be coupled between the internal clock generating circuit 1322 and the clock-distribution network 1323. Any one of connection relationships among elements within the semiconductor apparatus 100, 800, 1100 and 1200 illustrated in FIGS. 1, 8, 11 and 12 may be applied as connection relationships among the internal clock generating circuit 1322, the stop controlling circuit 1325, the dock-distribution network 1323 and the data clock generating circuit 1324. The second semiconductor apparatus 1320 may further include a plurality of data clock generating circuits. The dock-distribution network 1323 may distribute clock signals to all data clock generating circuits including the data clock generating circuit 1324.

The command decoder 1326 may receive the command signal CMD provided from the first semiconductor apparatus 1310 through the command bus 1302. The command decoder 1326 may decode the command signal CMD to generate various internal command signals. The mode setting circuit 1327 may store therein various operation parameters of the second semiconductor apparatus 1320. The various operation parameters may include an operating resistance value of the second semiconductor apparatus 1320. The mode setting circuit 1327 may provide the data clock transmitter 1324-2 of the data clock generating circuit 1324 with the resistance setting signal RON<1:n> for determining the operating resistance value of the second semiconductor apparatus 1320. When the second semiconductor apparatus 1320 receives the command signal CMD regarding the resistance setting from the first semiconductor apparatus 1310, the mode setting circuit 1327 may change a value of the resistance setting signal RON<1:n> based on the internal command signal.

The first semiconductor apparatus 1310 may stop the system clock signal to measure the operating resistance value of the data clock transmitter 1324-2. The first semiconductor apparatus 1310 may fix the pair of system clock signals CLKT and CLKC to different logic levels to stop the pair of system clock signals CLKT and CLKC. Through the stop controlling circuit 1325, the second semiconductor apparatus 1320 may fix the pair of data clock signals DQST and DQSC to different logic levels. The monitoring circuit 1313 may monitor the pair of data clock signals DQST and DQSC fixed to different logic levels to generate the result MNT of the monitoring. The command generating circuit 1312 may generate the command signal CMD regarding the resistance setting. Based on the command signal CMD, the second semiconductor apparatus 1320 may adjust the value of the resistance setting signal RON<1:n>. Based on the resistance setting signal RON<1:n>, the data clock transmitter 1324-2 may adjust driving force and/or strength for driving the pair of data clock signals DQST and DQSC.

While certain embodiments have been described above, it will be understood to those skilled in the art that the embodiments described are by way of example only. Accordingly, the semiconductor apparatus including a clock path should not be limited based on the described embodiments. Rather, the semiconductor apparatus including a clock path described herein should only be limited in light of the claims that follow when taken in conjunction with the above description and accompanying drawings.

What is claimed is:

1. A semiconductor system comprising:
    a first semiconductor apparatus configured to provide a system clock signal, configured to receive a data clock signal and a complementary data clock signal, and configured to generate a command signal based on the data clock signal and the complementary data clock signal; and
    a second semiconductor apparatus configured to generate a plurality of internal clock signals based on the system clock signal, configured to generate the data clock signal and the complementary data clock signal based on the plurality of internal clock signals, configured to fix the data clock signal and the complementary data clock signal to different logic levels when the system clock signal stops and configured to adjust driving force for driving the data clock signal and the complementary data clock signal based on the command signal.

2. The semiconductor system of claim 1, wherein the first semiconductor apparatus includes:
    a system clock generating circuit configured to generate the system clock signal;
    a monitoring circuit configured to monitor the data clock signal and the complementary data clock signal to generate a result of the monitoring; and
    a command generating circuit configured to generate the command signal based on the result of the monitoring.

3. The semiconductor system of claim 1, wherein the second semiconductor apparatus includes:
    an internal clock generating circuit configured to generate, based on a reference clock signal generated from the system clock signal, the plurality of internal clock signals having different phases;
    a stop controlling circuit configured to generate a stop signal based on the plurality of internal clock signals and configured to generate a clock level signal based on the reference clock signal and the stop signal; and
    a data clock generating circuit configured to generate the data clock signal and the complementary data clock signal based on the plurality of internal clock signals, the stop signal and the clock level signal.

4. The semiconductor system of claim 3, wherein the internal clock generating circuit includes:
    a delay-locked loop circuit configured to perform a delay-locking operation based on the reference clock signal to generate a delay-locked clock signal; and
    a multi-phase clock generating circuit configured to generate the plurality of internal clock signals based on the delay-locked clock signal.

5. The semiconductor system of claim 4, further comprising a clock-distribution network configured to drive the delay-locked clock signal to provide the multi-phase clock generating circuit with the delay-locked clock signal.

6. The semiconductor system of claim 3, wherein the stop controlling circuit includes:
    a stop signal generating circuit configured to detect logic levels of the plurality of internal clock signals to generate the stop signal; and
    a gating circuit configured to generate, when the stop signal is enabled, the clock level signal having a logic level corresponding to the reference clock signal.

7. The semiconductor system of claim 3, wherein the data clock generating circuit is configured to:
    generate the data clock signal and the complementary data clock signal based on a logic level of the internal clock signal when the stop signal is disabled, and
    generate the data clock signal and the complementary data clock signal based on the clock level signal when the stop signal is enabled.

8. The semiconductor system of claim 3, further comprising a clock-distribution network configured to drive the plurality of internal clock signals to provide the data clock generating circuit with the plurality of internal clock signals.

9. The semiconductor system of claim 1, wherein the second semiconductor apparatus includes:
    an internal clock generating circuit configured to generate, based on a reference clock signal generated from the system clock signal, the plurality of internal clock signals having different phases;
    a stop controlling circuit configured to generate a stop signal based on the plurality of internal clock signals, configured to generate a clock level signal based on the reference clock signal and the stop signal and configured to generate a plurality of output clock signals based on the plurality of internal clock signals, the stop signal and the clock level signal; and
    a data clock generating circuit configured to generate a data clock signal and a complementary data clock signal based on the plurality of output clock signals.

10. The semiconductor system of claim 9, wherein the internal clock generating circuit includes:
    a delay-locked loop circuit configured to perform a delay-locking operation based on the reference clock signal to generate a delay-locked clock signal; and
    a multi-phase clock generating circuit configured to receive the delay-locked clock signal to generate the plurality of internal clock signals.

11. The semiconductor system of claim 10, further comprising a clock-distribution network configured to drive the delay-locked clock signal to provide the multi-phase clock generating circuit with the delay-locked clock signal.

12. The semiconductor system of claim 9, wherein the stop controlling circuit includes:
    a stop signal generating circuit configured to detect logic levels of the plurality of internal clock signals to generate the stop signal;

a gating circuit configured to generate, when the stop signal is enabled, the clock level signal having a logic level corresponding to the reference clock signal; and an output clock generating circuit configured to provide the plurality of internal clock signals as the plurality of output clock signals when the stop signal is disabled and configured to fix the plurality of output clock signals to predetermined logic levels based on the clock level signal when the stop signal is enabled.

13. The semiconductor system of claim 9, further comprising a clock-distribution network configured to drive the plurality of output clock signals to provide the data clock generating circuit with the plurality of output clock signals.

14. The semiconductor system of claim 1, wherein the second semiconductor apparatus further includes:

a command decoder configured to generate an internal command signal based on the command signal; and a mode setting circuit configured to generate a resistance setting signal based on the internal command signal, and wherein driving force for driving the data clock signal and the complementary data clock signal is adjusted on a basis of the resistance setting signal.

* * * * *